(12) United States Patent
Kamikawa et al.

(10) Patent No.: US 12,205,847 B2
(45) Date of Patent: Jan. 21, 2025

(54) METHOD OF REMOVING A SUBSTRATE WITH A CLEAVING TECHNIQUE

(71) Applicant: The Regents of the University of California, Oakland, CA (US)

(72) Inventors: Takeshi Kamikawa, Kyoto (JP); Srinivas Gandrothula, Santa Barbara, CA (US); Hongjian Li, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 17/945,717

(22) Filed: Sep. 15, 2022

(65) Prior Publication Data

US 2023/0005793 A1    Jan. 5, 2023

Related U.S. Application Data

(63) Continuation of application No. 16/642,298, filed as application No. PCT/US2018/051375 on Sep. 17, 2018, now Pat. No. 11,508,620.

(Continued)

(51) Int. Cl.
*H01L 21/78* (2006.01)
*H01L 21/02* (2006.01)
(Continued)

(52) U.S. Cl.
CPC ...... *H01L 21/7813* (2013.01); *H01L 21/0254* (2013.01); *H01L 21/02647* (2013.01);
(Continued)

(58) Field of Classification Search
None
See application file for complete search history.

(56) References Cited

U.S. PATENT DOCUMENTS 8,259,769 B1   9/2012 Raring et al.
8,284,810 B1  10/2012 Sharma et al.
(Continued)

FOREIGN PATENT DOCUMENTS

CN   103456850 A   12/2013
CN   104836117 A    8/2015
(Continued)

OTHER PUBLICATIONS

WO 2016/186654A1, Radosavljevic et al, Semiconductor Devices with Raised Doped Crystalline Structures, Nov. 24, 2016, pp. 1-40. (Year: 2016).*

(Continued)

*Primary Examiner* — Alexander G Ghyka
(74) *Attorney, Agent, or Firm* — Gates & Cooper LLP

(57) ABSTRACT

A method of removing a substrate from III-nitride based semiconductor layers with a cleaving technique. A growth restrict mask is formed on or above a substrate, and one or more III-nitride based semiconductor layers are grown on or above the substrate using the growth restrict mask. The III-nitride based semiconductor layers are bonded to a support substrate or film, and the III-nitride based semiconductor layers are removed from the substrate using a cleaving technique on a surface of the substrate. Stress may be applied to the III-nitride based semiconductor layers, due to differences in thermal expansion between the III-nitride substrate and the support substrate or film bonded to the III-nitride based semiconductor layers, before the III-nitride based semiconductor layers are removed from the substrate. Once removed, the substrate can be recycled, resulting in cost savings for device fabrication.

9 Claims, 49 Drawing Sheets

Related U.S. Application Data

(60) Provisional application No. 62/559,378, filed on Sep. 15, 2017.

(51) Int. Cl.
    *H01L 33/00*          (2010.01)
    *H01S 5/02*           (2006.01)

(52) U.S. Cl.
    CPC ...... *H01L 33/0075* (2013.01); *H01L 33/0093* (2020.05); *H01S 5/0202* (2013.01)

(56) References Cited

U.S. PATENT DOCUMENTS

| | | |
|---|---|---|
| 2007/0164306 A1 | 7/2007 | Nakahata et al. |
| 2008/0163814 A1 | 7/2008 | Kim et al. |
| 2012/0269220 A1 | 10/2012 | Kyono et al. |
| 2012/0280363 A1 | 11/2012 | Sumida et al. |
| 2013/0323906 A1 | 12/2013 | Kim et al. |
| 2015/0229100 A1 | 8/2015 | Sztein et al. |
| 2015/0279903 A1 | 10/2015 | Mandl et al. |
| 2015/0318436 A1 | 11/2015 | Heo et al. |
| 2016/0035935 A1 | 2/2016 | Han et al. |
| 2017/0005224 A1 | 1/2017 | Shur et al. |
| 2017/0077672 A1 | 3/2017 | Sakata et al. |
| 2017/0236807 A1 | 8/2017 | Hwang et al. |

FOREIGN PATENT DOCUMENTS

| | | |
|---|---|---|
| EP | 2469581 A1 | 6/2012 |
| JP | 2006005331 A | 1/2006 |
| JP | 2007096114 A | 4/2007 |
| JP | 2013-201412 | 10/2013 |
| JP | 2013201412 A | 10/2013 |
| JP | 2013251304 A | 12/2013 |
| JP | 5561489 B | 7/2014 |
| JP | 2015504242 A | 2/2015 |
| JP | 2015154074 A | 8/2015 |
| JP | 2020-534687 | 11/2020 |
| WO | 2011021710 A1 | 2/2011 |
| WO | 2013089417 A1 | 6/2013 |

OTHER PUBLICATIONS

Japanese Notice of Final Rejetion (with English translation) dated Dec. 28, 2022 for Japanese Patent Application No. 2020-515181.

Chinese Office Action dated Jan. 28, 2023 for Chinese Application No. 201880060140.4.

European Search Report dated Aug. 4, 2021 for EP Application No. EP 18857235.

European Search Report dated May 4, 2021 for EP Application No. EP 18857235.

Japanese Notice of Reasons for Rejection (with English translation) dated Apr. 11, 2022 for Japanese Patent Application No. 2020-515181.

Japanese Notice of Reasons for Rejection dated Jun. 11, 2021 for JP Application No. 2020-515181.

PCT International Search Report & Written Opinion dated Nov. 20, 2018, PCT Application No. PCT/US2018/051375.

Japanese Notice of Reasons for Rejection (with English translation) dated Nov. 27, 2023 for Japanese Application No. 2022-163051.

Daiki Jinno et al., Selective Area Growth of Semipolar (20-21) and (20-2-1) GaN Substrates by Metalorganic Vapor Phase Epitaxy, Japanese Journal of Applied Physics, Japan, May 31, 2013, vol. 52, No. 8S, 08JC06-1-08JC06-4.

Japanese Notice of Reasons for Rejection dated Aug. 28, 2024 for Japanese Application No. 2022-163051.

\* cited by examiner

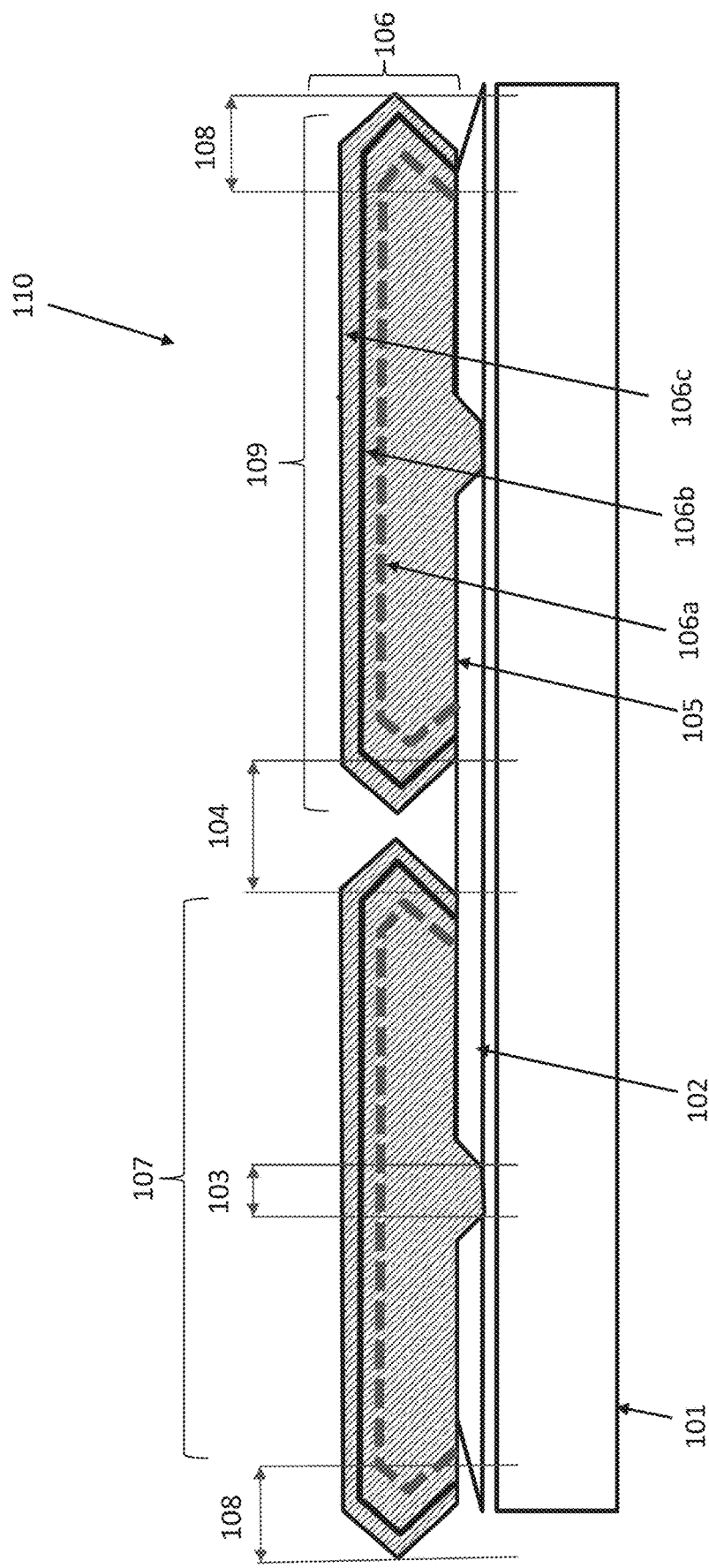

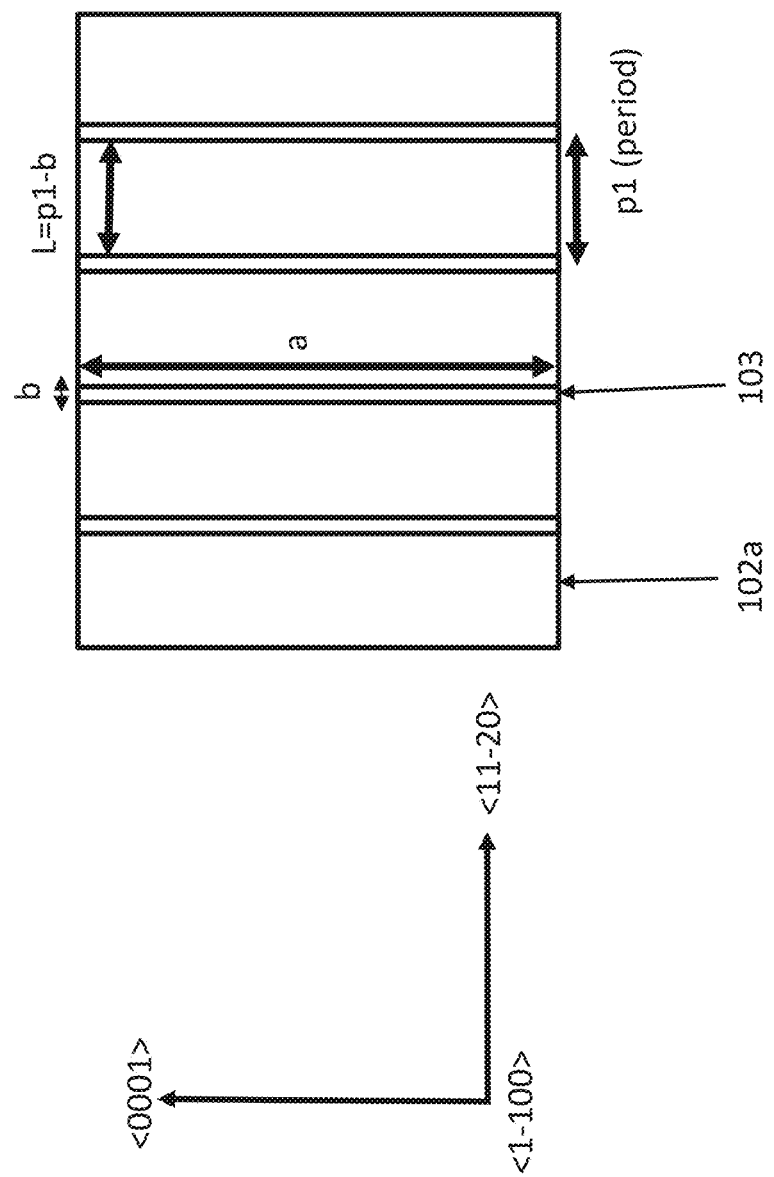

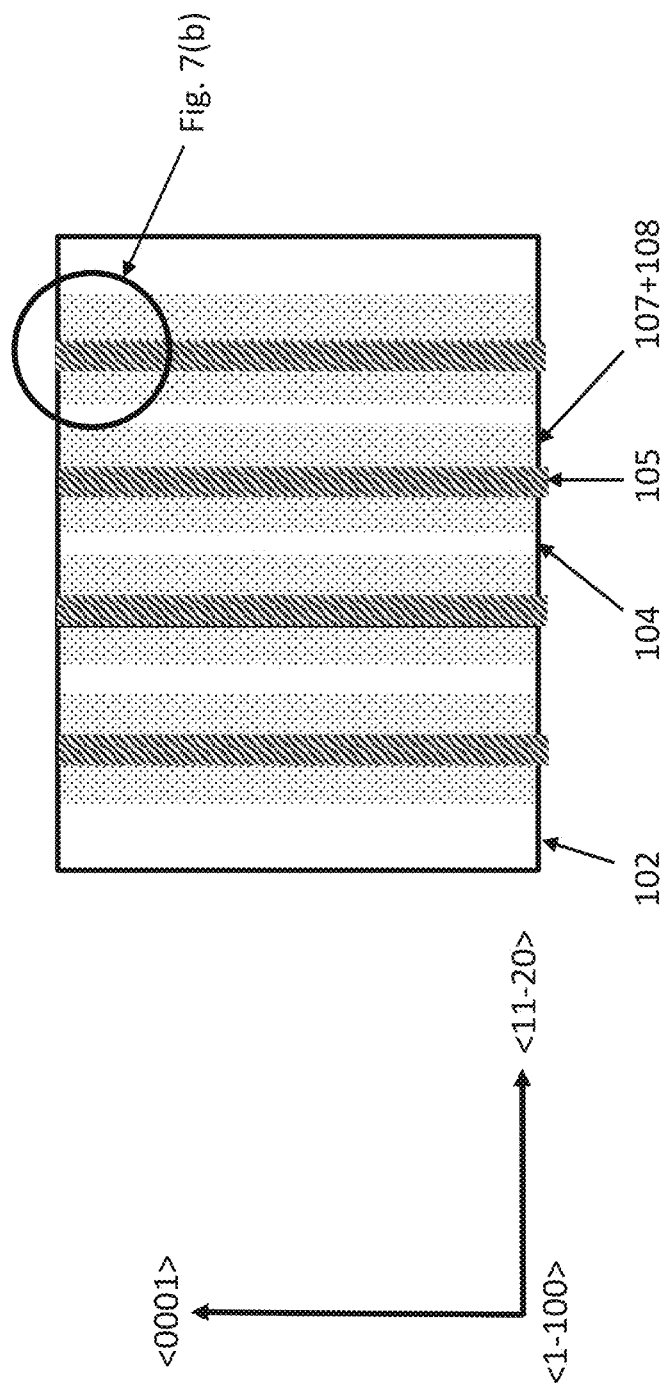

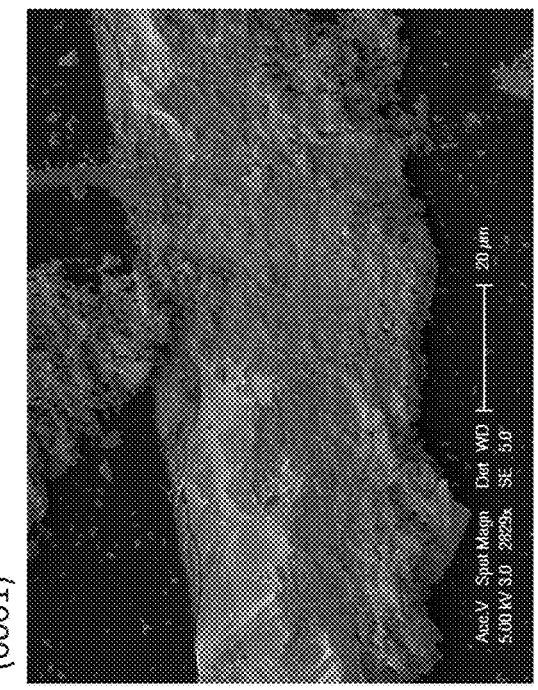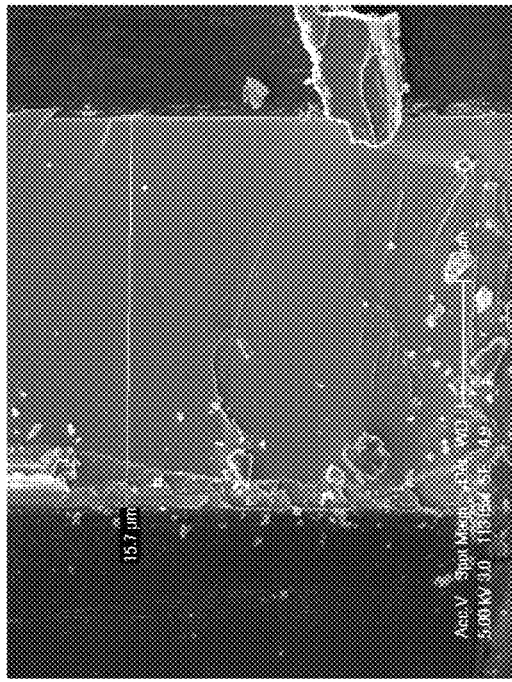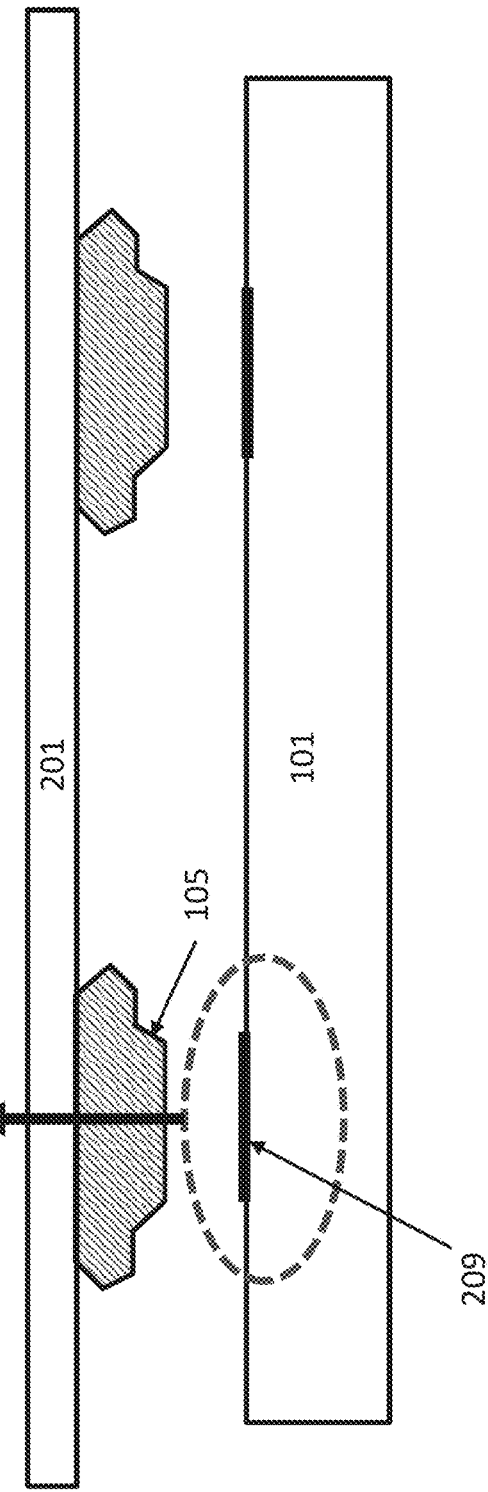
Fig. 8

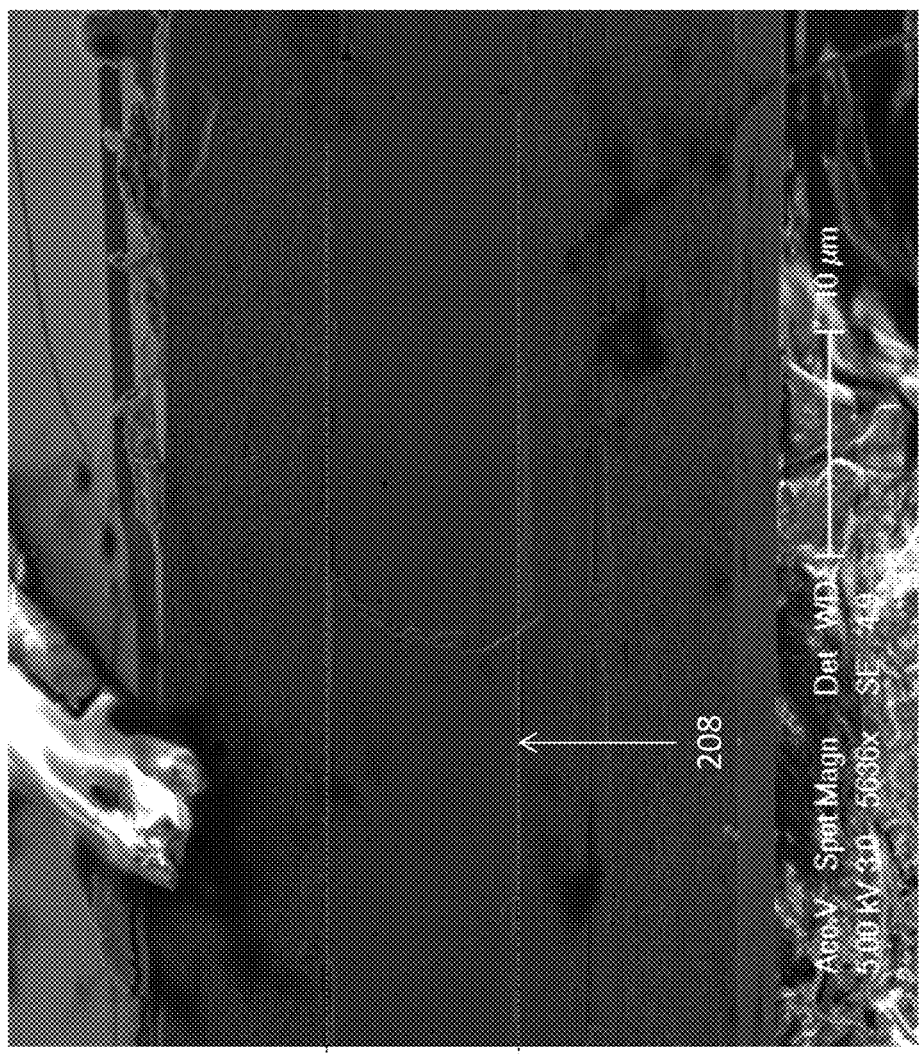
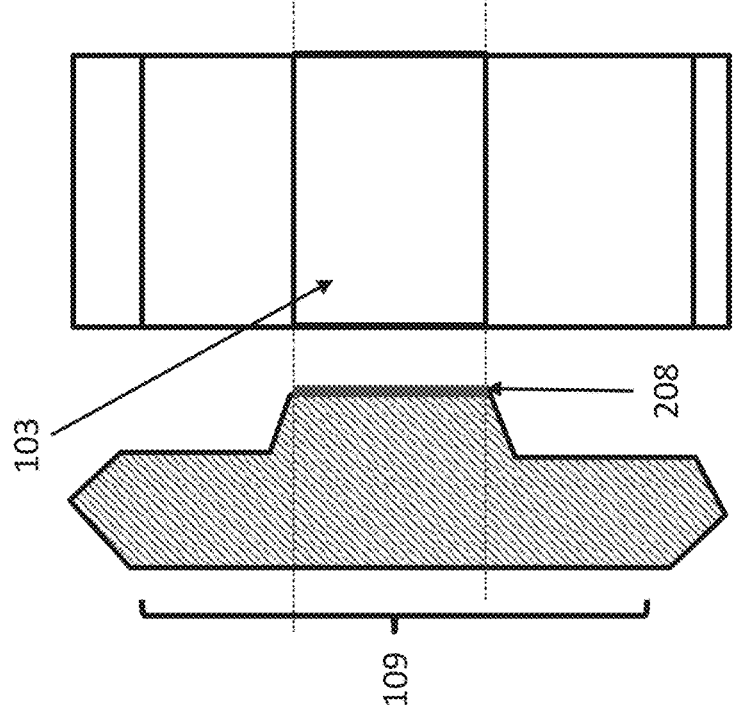
Fig. 9(b)

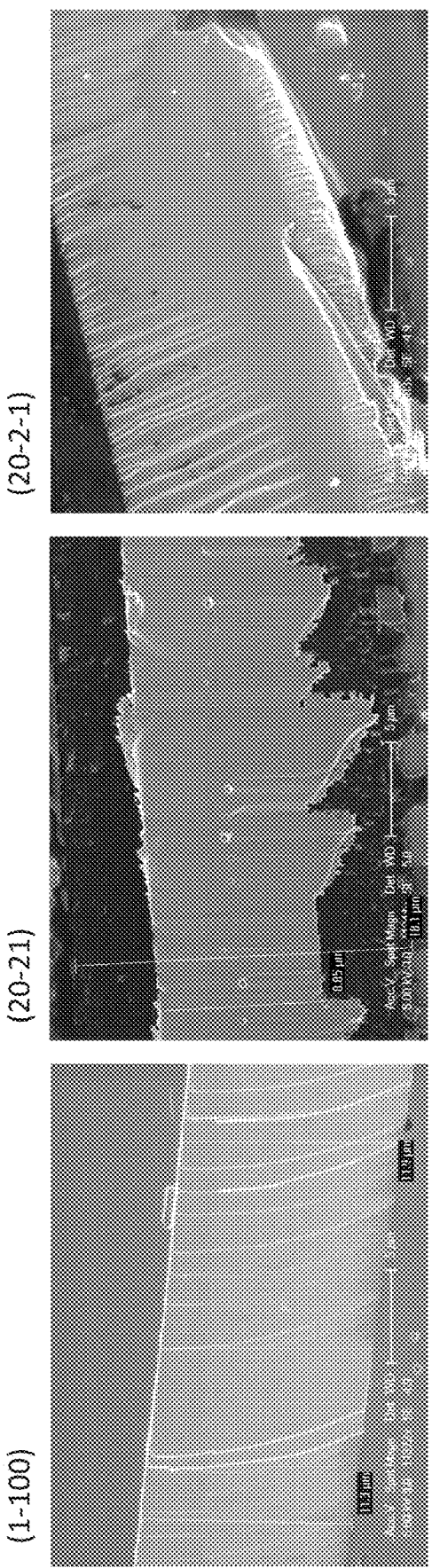
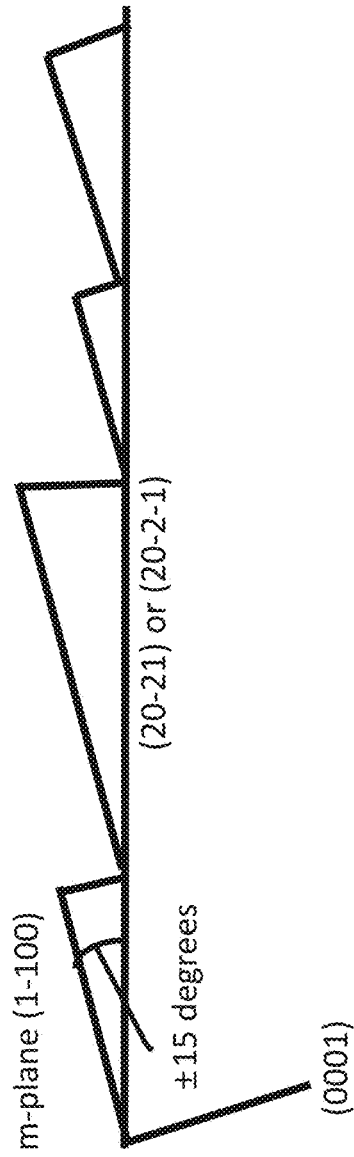
Fig. 10(a)
Fig. 10(b)
Fig. 10(c)
Fig. 10(d)

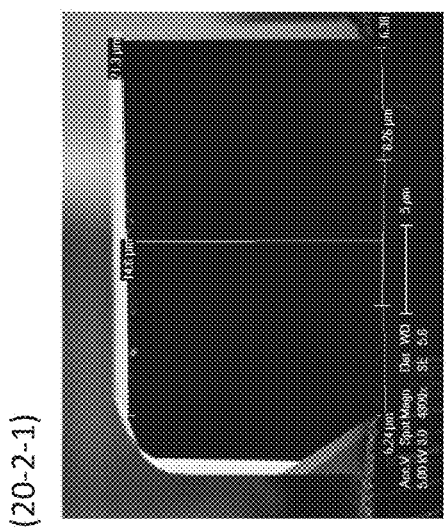
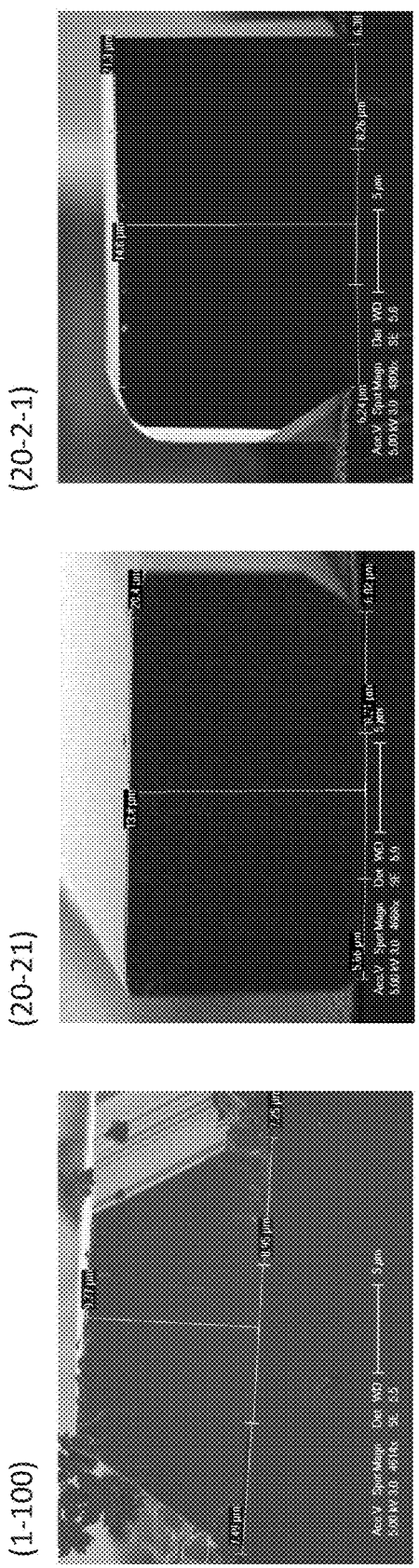
Fig. 12(a) (1-100)
Fig. 12(b) (1-100)
Fig. 12(c) (20-21)
Fig. 12(d) (20-21)
Fig. 12(e) (20-2-1)
Fig. 12(f) (20-2-1)

METHOD OF REMOVING A SUBSTRATE WITH A CLEAVING TECHNIQUE

CROSS REFERENCE TO RELATED APPLICATION

This application claims the benefit under 35 U.S.C. Section 120 of the following co-pending and commonly-assigned applications:

U.S. Utility patent application Ser. No. 16/642,298, filed on Feb. 26, 2020, by Takeshi Kamikawa, Srinivas Gandrothula and Hongjian Li, entitled "METHOD OF REMOVING A SUBSTRATE WITH A CLEAVING TECHNIQUE," which application claims the benefit under 35 U.S.C. Section 365(c) of co-pending and commonly-assigned PCT International Patent Application No. PCT/US18/51375, filed on Sep. 17, 2018, by Takeshi Kamikawa, Srinivas Gandrothula and Hongjian Li, entitled "METHOD OF REMOVING A SUBSTRATE WITH A CLEAVING TECHNIQUE," which application claims the benefit under 35 U.S.C. Section 119(e) of co-pending and commonly-assigned U.S. Provisional Patent Application No. 62/559,378, filed on Sep. 15, 2017, by Takeshi Kamikawa, Srinivas Gandrothula and Hongjian Li, entitled "METHOD OF REMOVING A SUBSTRATE WITH A CLEAVING TECHNIQUE,";

all of which applications are incorporated by reference herein.

This application is related to the following co-pending and commonly-assigned applications:

PCT International Patent Application No. PCT/US18/31393, filed on May 7, 2018, by Takeshi Kamikawa, Srinivas Gandrothula, Hongjian Li and Daniel A. Cohen, entitled "METHOD OF REMOVING A SUBSTRATE," which application claims the benefit under 35 U.S.C. Section 119(e) of co-pending and commonly-assigned U.S. Provisional Patent Application No. 62/502,205, filed on May 5, 2017, by Takeshi Kamikawa, Srinivas Gandrothula, Hongjian Li and Daniel A. Cohen, entitled "METHOD OF REMOVING A SUBSTRATE,"; and U.S. Provisional Patent Application No. 62/650,487, filed on Mar. 30, 2018, by Takeshi Kamikawa, Srinivas Gandrothula and Hongjian Li, entitled "METHOD OF FABRICATING NON-POLAR AND SEMI-POLAR DEVICES USING EPITAXIAL LATERAL OVERGROWTH,";

all of which applications are incorporated by reference herein.

BACKGROUND OF THE INVENTION

1. Field of the Invention

This invention relates to a method of removing a III-nitride based substrate from III-nitride based semiconductor layers with a cleaving technique.

2. Description of the Related Art

Many device manufacturers have used free-standing bulk GaN substrates to produce laser diodes (LDs) and light-emitting diodes (LEDs) for lighting, optical storage, and other purposes. GaN substrates are attractive in that it is easy to obtain high-quality III-nitride based semiconductor layers having low defect densities by homo-epitaxial growth on GaN substrates.

However, GaN substrates, which are typically produced using hydride vapor phase epitaxy (HVPE), are very expensive. Moreover, nonpolar and semipolar GaN substrates are more expensive than polar (c-plane) GaN substrates. For example, 2-inch polar GaN substrates cost about $1,000/wafer, while 2-inch nonpolar or semipolar GaN substrates cost about $10,000/wafer.

As a result, researchers have investigated removing III-nitride based semiconductor layers from GaN substrates after the device is manufactured. Such a technique would result in a GaN substrate that can be recycled, which would provide a very cheap and high quality GaN substrate for customers.

It is easy to remove epitaxial layers from a foreign substrate, such as sapphire/GaN, Si/GaN, etc., at a hetero-interface using laser ablation or other techniques. However, GaN substrates and III-nitride based semiconductor layers lack a hetero-interface, which makes it difficult to remove the III-nitride based semiconductor layers from GaN substrates.

Consequently, there is a need for a technique that removes III-nitride based semiconductor layers from III-nitride based substrates or layers in an easy manner.

In one previous technique, a GaN layer is spalled by a stressor layer of metal under tensile strain. See, e.g., Applied Physics Express 6 (2013) 112301 and U.S. Pat. No. 8,450,184, both of which are incorporated by reference herein. Specifically, this technique uses spalling in the middle of the GaN layer.

However, surface morphology on a spalling plane is rough and this technique cannot be controlled at the spalling position. Moreover, this removal method may damage the semiconductor layers due to excess bending in the layer that is being removed, which may result in cracks in unintended directions. Thus, it is necessary to reduce any such damage and surface roughness.

Another conventional technique is the use of photoelectrochemical (PEC) etching of sacrificial layers to remove device structures from GaN substrates, but this takes a long time and involves several complicated processes. Moreover, the yield from these processes have not reached industry expectations.

Thus, there is a need in the art for improved methods of removing III-nitride based substrates from III-nitride based semiconductor layers, especially where GaN thin films are grown on GaN substrates. The present invention satisfies this need.

SUMMARY OF THE INVENTION

To overcome the limitations in the prior art described above, and to overcome other limitations that will become apparent upon reading and understanding this specification, the present invention discloses a method of removing a III-nitride substrate from III-nitride based semiconductor layers with a cleaving technique. The method uses epitaxial lateral overgrowth (ELO) of the III-nitride based semiconductor layers on a growth restrict mask or layer, the application of stress to the III-nitride based semiconductor layers due to differences in thermal expansion between the III-nitride substrate and a support substrate or film contacted to the III-nitride based semiconductor layers, as well as cleaving of the III-nitride based semiconductor layers from a cleaving point on a nonpolar (m-plane) growth surface on the III-nitride based substrate. Once removed, the III-nitride based substrates can be recycled, resulting in cost savings for device fabrication. The method provides advantages in the fabrication of both laser diodes and light-emitting diodes: easy removal of the III-nitride based substrates, little damage to the III-nitride based semiconductor layers, smooth cleaving surfaces, and short processing time.

BRIEF DESCRIPTION OF THE DRAWINGS

Referring now to the drawings in which like reference numbers represent corresponding parts throughout:

FIG. 1 is a schematic of a device structure fabricated according to the present invention.

FIGS. 3(a) and 3(b) illustrate the growth restrict mask and the opening areas of the growth restrict mask.

FIGS. 7(a) and 7(b) illustrate how laser facets are formed and how chip scribing is performed.

FIG. 8 shows scanning electron microscope (SEM) images of a (1-100) surface of a III-nitride based substrate after removing island-like III-nitride based semiconductor layers, and a (0001) surface as a reference.

FIGS. 9(a) and 9(b) are SEM images of an island-like III-nitride based semiconductor layer which is a bar with length over 300 µm after being removed from the substrate.

FIGS. 10(a), 10(b), 10(c), 10(d), 10(e), 10(f), 10(g) and 10(h) are a schematic and SEM images of III-nitride based semiconductor layers on different surface orientations.

FIGS. 12(a), 12(b), 12(c), 12(d), 12(e), 12(f), 12(g), 12(h) and 12(i) illustrate ELO AlGaN layers.

DETAILED DESCRIPTION OF THE INVENTION

Figure 2A:
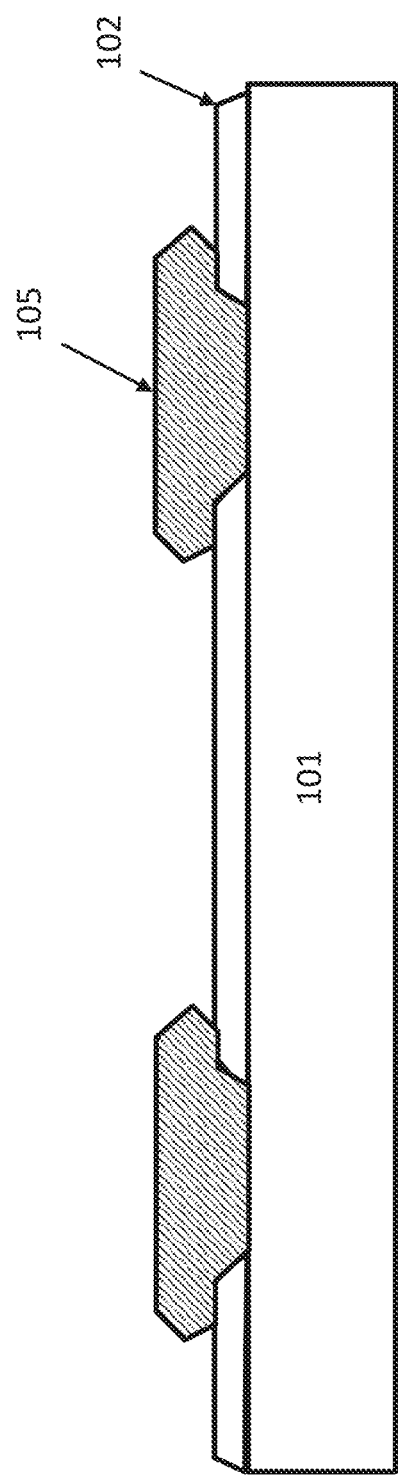
FIGS. 2(a), 2(b), 2(c), 2(d), 2(e) and 2(f) are schematics illustrating the steps performed during the fabrication of device structures.

In the following description of the preferred embodiment, reference is made to a specific embodiment in which the invention may be practiced. It is to be understood that other embodiments may be utilized and structural changes may be made without departing from the scope of the present invention.

Overview

The present invention discloses a method for removing a III-nitride based substrate from epitaxially-grown III-nitride based semiconductor layers using a foreign or hetero-substrate as a support substrate, and specifically, a method of removing a III-nitride based substrate from III-nitride based semiconductor layers with a cleaving technique, so that the III-nitride based substrate can be recycled.

As long as it enables growth of a III-nitride layer through a growth restrict mask, any III-nitride based substrate, such as GaN, may be used. In alternative embodiments, a foreign or hetero-substrate, such as sapphire ($Al_2O_3$), SiC, $LiAlO_2$, Si, etc., may be substituted for the III-nitride based substrate.

The III-nitride based semiconductor layers and the III-nitride based substrate refer to any composition or material related to (B, Al, Ga, In)N semiconductors having the formula $B_wAl_xGa_yIn_zN$ where $0 \leq w \leq 1$, $0 \leq x \leq 1$, $0 \leq y \leq 1$, $0 \leq z \leq 1$, and $w+x+y+z=1$. Further, compositions and materials within the scope of the invention may further include quantities of dopants and/or other impurity materials and/or other inclusional materials such as Mg, Si, O, C, H, etc.

Island-like III-nitride based semiconductor layers are epitaxially grown on the III-nitride based substrate at an opening area and/or through an intermediate layer at the opening area. The quality of the III-nitride based semiconductor layers is extremely high, and a device comprised of the III-nitride based semiconductor layers is of extremely high quality. However, it is hard to separate the III-nitride based semiconductor layers from the III-nitride based substrate.

It has been discovered that the III-nitride based semiconductor layers can be removed from the III-nitride based substrate very easily using a cleaving technique at a cleaving point on a surface of the III-nitride based substrate.

One technique is to use a growth restrict mask, which is a dielectric film or refractory metal, such as $SiO_2$, SiN, $HfO_2$, $Al_2O_3$, MgF, AlN, etc., in this substrate removal technique. It is possible to use a multi-layer structure selected from the above materials, such as $Si_2$/AlN, AlN/$SiO_2$, $SiO_2$/SiN, SiN/$SiO_2$. The interface between the growth restrict mask and any subsequent III-nitride based semiconductor layers grown by ELO on the mask has a weak bonding strength.

The bonding area between the III-nitride based semiconductor layers and the III-nitride based substrate is controlled so that it is less than the device size. Thus, it is easy to remove the layers from the substrate.

Furthermore, the island-like III-nitride based semiconductor layers do not coalesce with each other, and internal strain is released. This is to avoid any occurrences of cracks.

In addition, these methods use characteristics of cleaving at an m-plane, which is the easiest plane among GaN planes to cleave. In alternative embodiments, other planes of the substrate may be used.

This method also determines the cleaving point to use at the start of the cleaving technique. In one embodiment, the cleaving point is at an edge of the growth restrict mask on the substrate.

This method also dissolves the mask using a hydrofluoric acid (HF), buffered HF (BHF), or another etchant, before removing the substrate. Thereafter, the III-nitride based semiconductor layers are bonded to a support substrate using a low temperature melted metal and/or solder, wherein the metal is later dissolved by an etchant.

It is possible to use support substrates which have a thermal expansion different from the III-nitride based substrate. Both substrates are then heated after bonding. Stress is applied to the III-nitride based semiconductor layers, which are bonded to the support substrate, due to the differences in thermal expansion between the substrates.

If a film is used to remove the III-nitride based semiconductor layers from the substrate, the film is not always bonded to the III-nitride based semiconductor layers. The removal can be achieved by at least contacting the film with the semiconductor layers. The film may be a polymer film, which has already been commercialized for dicing. Using the film, the removal process can be performed repeatedly. In other words, even if the semiconductor layers cannot be removed in one step, this step can be performed several times. Many other removal methods are not repeatable.

This stress is applied at the cleaving point between the III-nitride based semiconductor layers and the III-nitride based substrate. The cleaving starts from one side of the cleaving point, which is at an edge of the growth restrict mask, and proceeds to the opposite side of cleaving point.

The chip size, which is the width of the island-like III-nitride based semiconductor layers, generally is wider than the cleaving length along the cleaving surface. As a result, less force or pressure can be used to remove the semiconductor layers. This avoids degradation of the device and reduction in yields.

The cleaving technique uses a trigger to start the cleaving technique. The trigger may be the stress resulting from the differences in thermal expansion, but other triggers may be used as well. For example, mechanical force, such as ultrasonic waves, can be used as the trigger for the cleaving technique.

If mechanical forces are used, removal of the III-nitride based substrate is achieved quickly and with very weak stress due to cleaving of the m-plane. Furthermore, the cleaving point may be a wedge shape, which simplifies the cleaving. The shape of the cleaving point is important to achieve a high yield.

Moreover, when the III-nitride based semiconductor layers are removed from the substrate, force can be applied using the differences of the thermal expansion between the film or support substrate and the semiconductor layers. This has the following advantages: 1) the force is applied uniformly; and 2) the strength and speed of the force can be controlled by changing the temperature. Thus, this method can be easily adopted for mass production.

Another aspect that must be considered when using the cleavability to remove the semiconductor layers from the substrate is how to apply the impact uniformly and adequately to the semiconductor layers. Even if the cleave length is wide, a device removed utilizing the cleavability of the GaN crystal needs the impact to start cleaving. It is effective to utilize the differences of the thermal expansion coefficient, so that the force can be applied uniformly to the semiconductor epilayer. If polymer films are used, the differences in the thermal expansion coefficient between the polymer film and the semiconductor layer are large, which makes the force strong.

Another way to use polymer films is that the polymer films can be expanded in one direction in order to remove the semiconductor layer without temperature change. Expanding the polymer films can apply the impact to the cleaving point.

Using these methods, device layers can be easily removed from the III-nitride based substrates and wafers, including wafers of large size, e.g., over 2 inches. For devices needing AlGaN layers, this is very useful, especially in the case of high Al content layers.

First Embodiment

Generally, the present invention describes a III-nitride based semiconductor device and a method for manufacturing the III-nitride based semiconductor device.

In a first embodiment, the method comprises the steps of: forming a growth restrict mask with a plurality of opening areas directly or indirectly upon a substrate, wherein the substrate is a III-nitride based semiconductor; growing a plurality of island-like III-nitride based semiconductor layers upon the substrate using the growth restrict mask, such that the growth extends in a direction parallel to the opening areas of the growth restrict mask, wherein each of the island-like III-nitride based semiconductor layers form a device; depositing p-electrodes on an exposed surface of the devices; bonding the p-electrodes of the devices to a support substrate or contacting the p-electrode to a film; at least partially dissolving the growth restrict mask using a wet etching technique; separating the III-nitride based substrate from the devices using thermal expansion and a cleaving technique; depositing n-electrodes on a surface of the devices exposed by the cleaving; and separating the devices by dividing the support substrate. The end results comprise one or more III-nitride based semiconductor devices, which may be opto-electronic devices, as well as a III-nitride based substrate that may be recycled and reused.

Specifically, the method includes the following steps:
1. Substrate, ELO+III-Nitride Based Semiconductor Layers This step is described in FIG. 1, which illustrates providing a III-nitride based substrate 101, such as a bulk GaN substrate 101. In this embodiment, the GaN-based substrate 101 has a growth surface that is an m-plane with a 1 degree mis-cut towards the (000-1) direction.

A growth restrict mask 102 is formed on or above the GaN-based substrate 101. Specifically, the growth restrict mask 102 is disposed directly in contact with the substrate 101, or is disposed indirectly through an intermediate layer grown by metalorganic chemical vapor deposition (MOCVD), etc., made of a III-nitride based semiconductor deposited on the substrate 101.

The growth restrict mask 102 can be formed from an insulator film, for example, an $SiO_2$ film deposited upon the base substrate 101, for example, by a plasma chemical vapor deposition (CVD) method, sputter, ion beam deposition (IBD), etc., wherein the $SiO_2$ film is then patterned by photolithography using a predetermined photo mask and etching to include opening areas 103, as well as no-growth regions 104 (which may or may not be patterned).

Epitaxial III-nitride layers 105, such as GaN-based layers 105, are grown by ELO on the GaN substrate 101 and the growth restrict mask 102. The growth of the ELO GaN-based layers 105 occurs first in the opening areas 103, on the GaN-based substrate 101, and then laterally from the opening areas 103 over the growth restrict mask 102. The growth of the ELO GaN-based layers 105 is stopped or interrupted before the ELO GaN-based layers 105 at adjacent opening areas 103 can coalesce on top of the growth restrict mask 102. This interrupted growth results in the no-growth regions 104 between adjacent ELO GaN-based layers 105.

Additional III-nitride semiconductor device layers 106 are deposited on or above the ELO GaN-based layers 105, and may include an active region 106a, an electron blocking layer (EBL) 106b, and a cladding layer 106c, as well as other layers.

The ELO GaN-based layers 105 and the additional III-nitride based semiconductor device layers 106 separated by no-growth regions 104 are referred to as island-like III-nitride based semiconductor layers 109. Each of the island-like III-nitride semiconductor layers 109 may be processed into a separate device 110.
2. Dissolving the Growth Restrict Mask by Wet Etching.

Figure 2B:
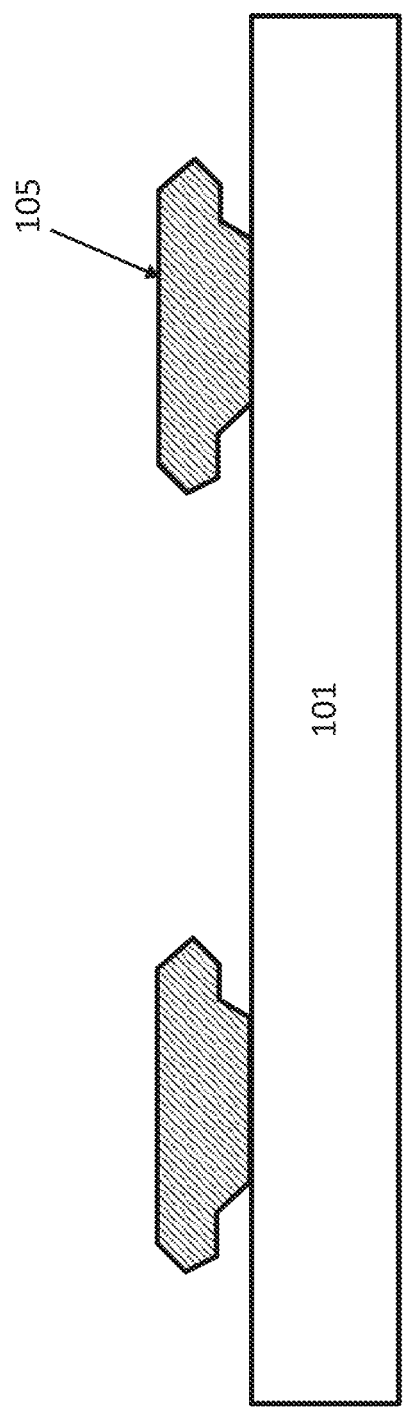

FIG. 2(a) is another view of the ELO GaN-based layers 105 grown on or above the GaN-based substrate 101 and then laterally over the growth restrict mask 102. As shown in FIG. 2(b), some or all of the $SiO_2$-based growth restrict mask 102 is optionally dissolved using a chemical solution, such as BHF, HF or another etchant. This allows the devices 110 to cleave from the GaN substrate 101 more easily, as described in more detail below.

3. p-Electrode Deposition.

Figure 2C:
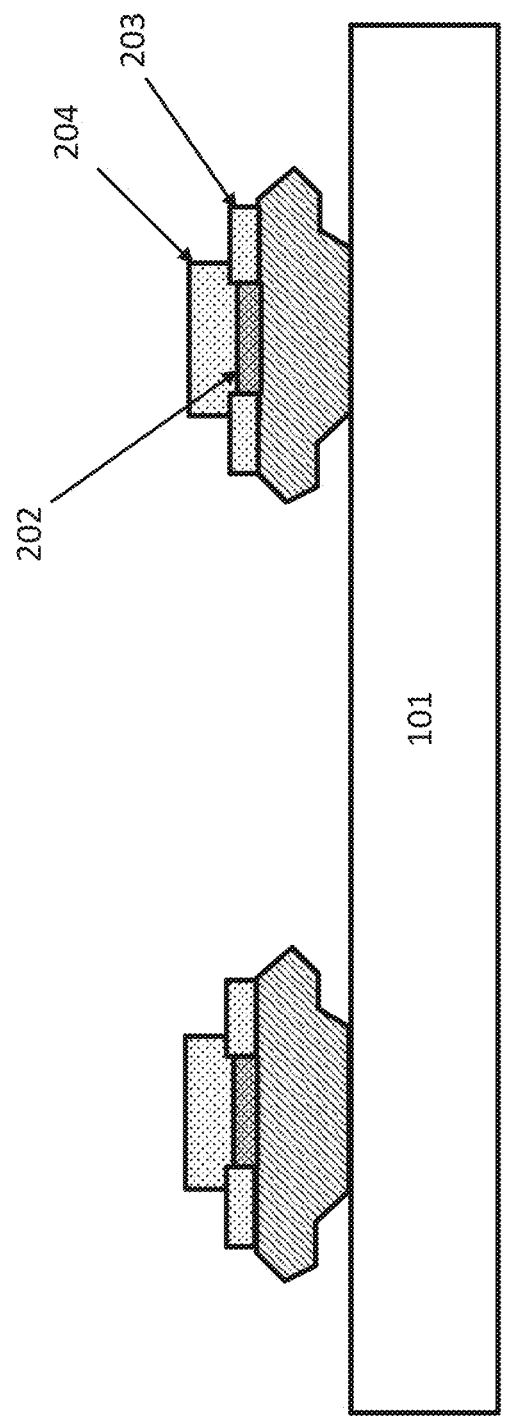

As show in FIG. 2(c), a Transparent Conductive Oxide (TCO) cladding layer 202 may be deposited on the devices 110, followed by the deposition of a $ZrO_2$ current limiting layer 203 and p-electrode 204.

4. Bonding the Support Substrate.

Figure 2D:
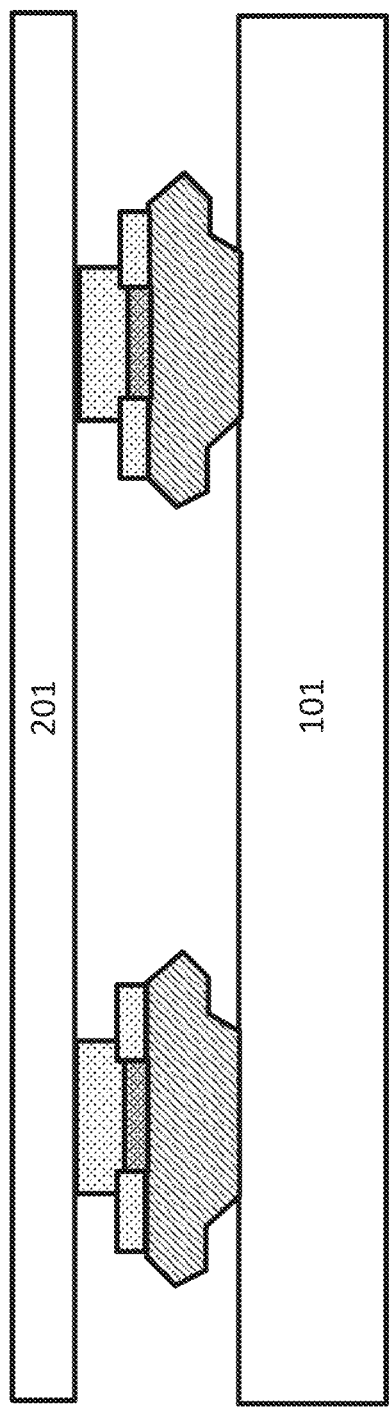

As shown in FIG. 2(d), the devices 110 are flip-chip bonded to a support substrate 201 using metal-metal bonding or soldering techniques with the p-electrodes 204. In one embodiment, the support substrate 201 is a Cu substrate, and patterned Ti/Au electrodes may be fabricated on the Cu substrate 201 by electron beam evaporation, sputter, thermal heat evaporation, etc., for subsequent bonding to the p-electrodes 204.

5. Removing the Substrate by Cleaving and Optional Thermal Expansion.

Figure 2E:
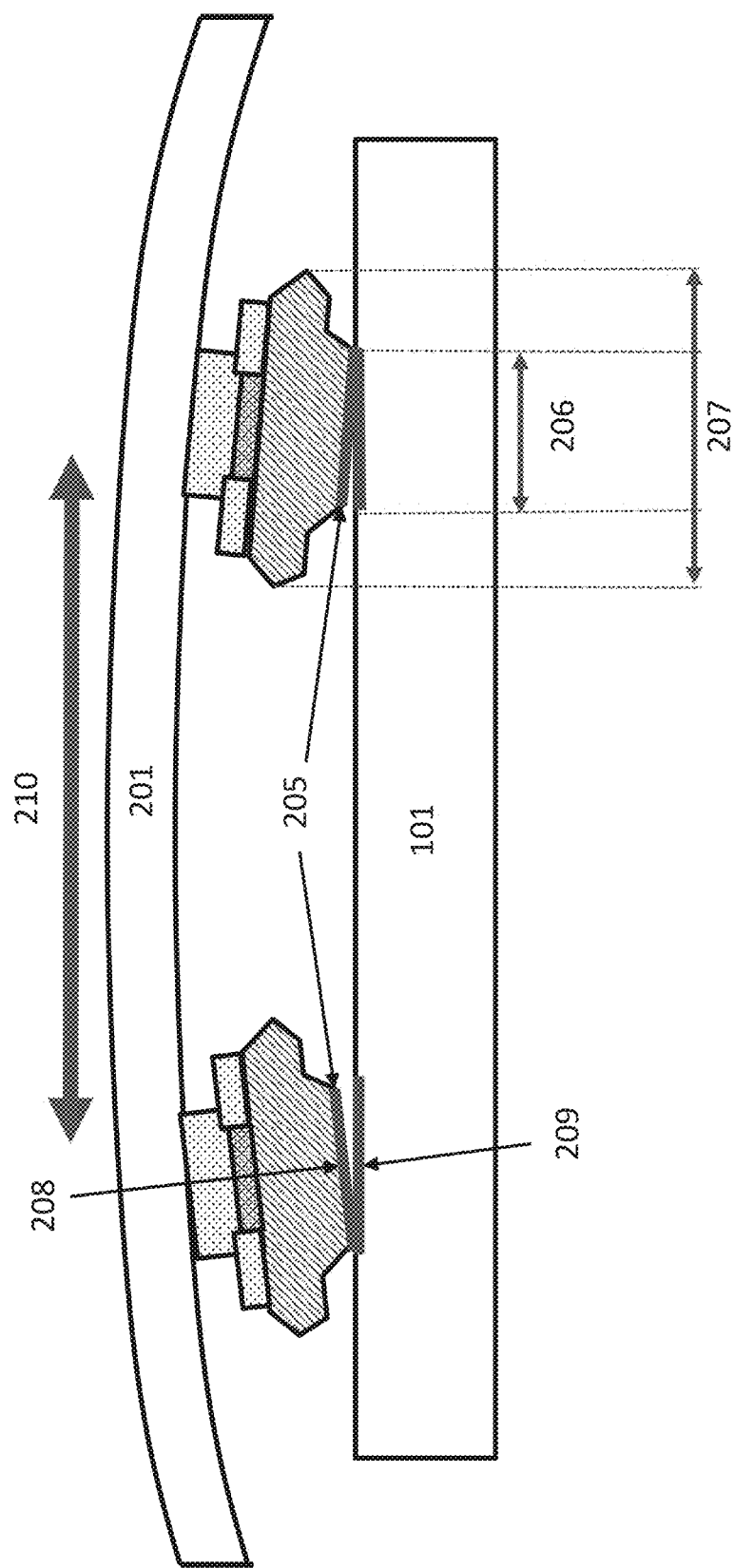

As shown in FIG. 2(e), the support substrate 201 is optionally heated so that thermal expansion 210 exposes cleaving points 205, and a cleaving technique is used to remove the devices 110 from the substrate 101 at the cleaving points 205 along a cleaving length 206, which may be less than the device size 207. The cleaving technique exposes a cleaving surface 208 of the device 110, as well as a cleaving surface 209 of the substrate 101. The cleaving surfaces 208, 209 may include an m-plane facet, or the cleaving surfaces 208, 209 as a whole may be m-plane, and/or the cleaving surfaces 208, 209 may include facets other than m-plane.

6. Deposition of an n-Electrode.

Figure 2F:
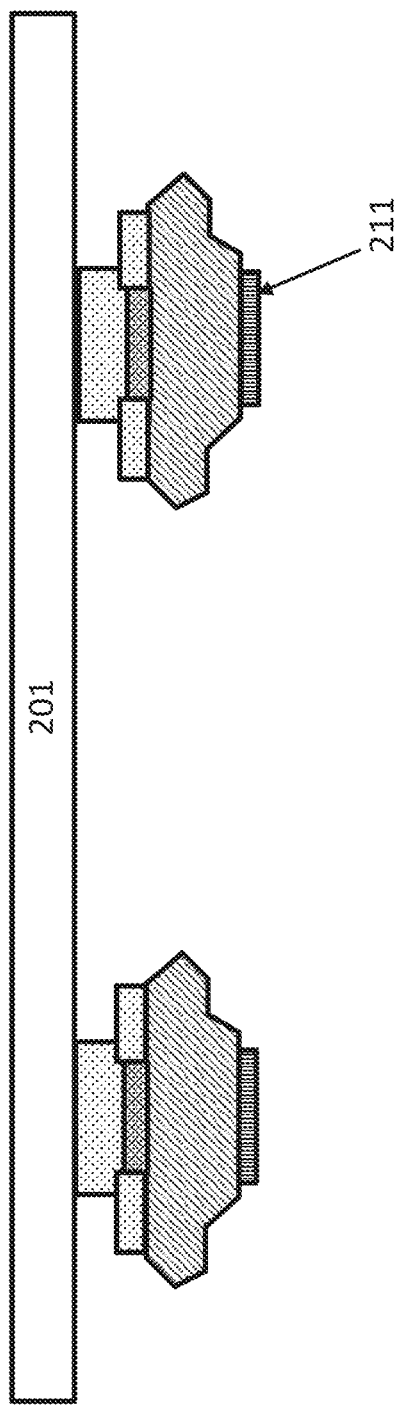

As shown in FIG. 2(f), n-electrodes 211, which may be comprised of TCO and Ti/Al, Ti/Au, Hf/Al/Mo/Au, etc., are deposited on the back-side of the devices 110.

7. Separating the Devices

Chip scribing may be performed to separate the devices 110.

These and other aspects of the present invention are described in more detail below.

Definitions of Terms

In this invention, the following terms are defined:

III-Nitride Based Substrate

In one embodiment, the III-nitride based substrate 101 is a GaN-based substrate 101. However, as long as a III-nitride based substrate 101 enables growth of ELO III-nitride based layers 105 through a growth restrict mask 102, any III-nitride based substrate 101 may be used.

Moreover, the III-nitride based substrate 101 may be sliced on a {1-100}, {20-21}, or {20-2-1} plane, or any other plane, from a bulk III-nitride based crystal, such as a nonpolar (1-100) m-plane GaN substrate 101 sliced from a bulk GaN crystal.

Growth Restrict Mask

The growth restrict mask 102 comprises a dielectric layer, such as $SiO_2$, SiN, SiON, $Al_2O_3$, AlN, AlON, MgF, etc., or a refractory metal, such as W, Mo, Ta, Nb, Pt, etc. The growth restrict mask 102 may be a laminate structure selected from the above materials. The growth restrict mask 102 also may be a stacking layer structure chosen from the above materials.

In one embodiment, the thickness of the growth restrict mask 102 is about 0.05-3 μm. The width of the mask 102 is preferably larger than 20 μm, and more preferably, the width is larger than 40 μm.

Figure 3B:
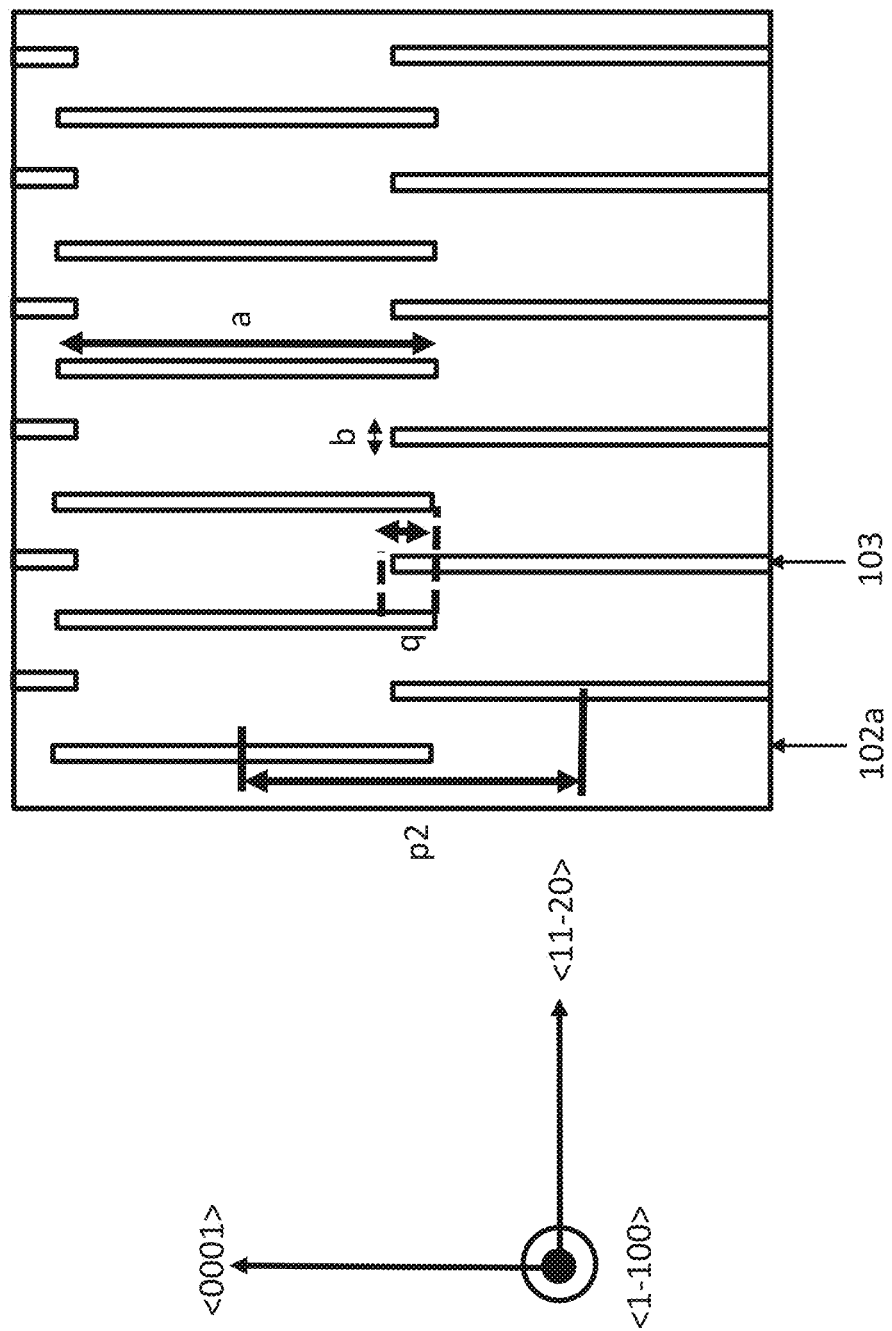

Two examples of the growth restrict mask 102 are shown in FIGS. 3(a) and 3(b).

As noted above, the growth restrict mask 102 is patterned into stripes 102a and includes opening areas 103 between the stripes 102a. In one embodiment shown in FIG. 3(a), the opening areas 103 have a length a and a width b. The length a of each of the opening areas 103 is in a first direction parallel to the 1-100 direction of the GaN-based substrate 101 and the width b of each of the opening areas 103 is in a second direction parallel to the 11-20 direction of the GaN-based substrate 101, with the opening areas 103 spaced apart periodically at a first interval p1, extending in the second direction. The width b of each of the opening areas 103 is typically constant, but may be changed as necessary. The width L of each of the stripes 102a of the growth restrict mask 102 is L=p1−b.

In another embodiment shown in FIG. 3(b), the length and width of each of the opening areas 103 are arranged in similar directions as FIG. 3(a), but the lengths a may be different and adjacent opening areas 103 are offset in the first direction by a second interval p2 and are shifted in the second direction by a half of the first interval p1, in a manner such that end portions of adjacent opening areas 103 overlap lengthwise for a predetermined distance q in the first direction. This arrangement prevents embossment of both end portions of the opening areas 103 in the 1-100 direction of the GaN-based substrate 101.

In both of these embodiments, the length a of the opening area 103 is about 200 to 2000 μm; the width b is about 0.5 to 20 μm; the intervals p1 and p2 of the opening areas 103 are about 6 to 120 μm; the width of the mask portion L is p1−b, so that, in the case of p1=55 μm and b=5 μm, L is 50 μm; and the overlapping length q of the end portions each other of the opening areas 103 is about 35 to 40 μm. However, other values may be used.

ELO III-Nitride Based Layers

In one embodiment, the ELO III-nitride based layers 105 are ELO GaN-based layers 105. However, any III-nitride based semiconductor may be used as the ELO III-nitride based layers 105.

Figure 4A:
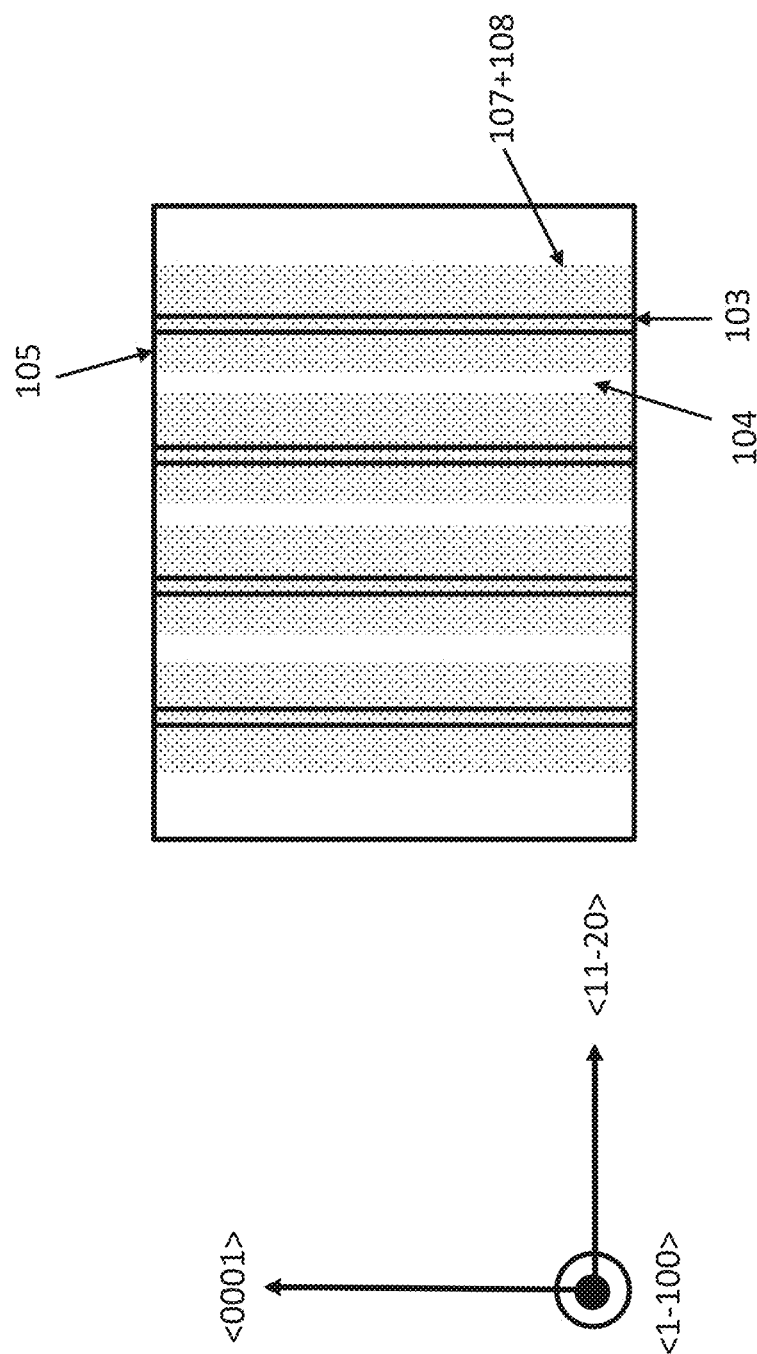
FIGS. 4(a) and 4(b) illustrate the flat surface regions and layer bending regions of the growth restrict mask.
Figure 4B:
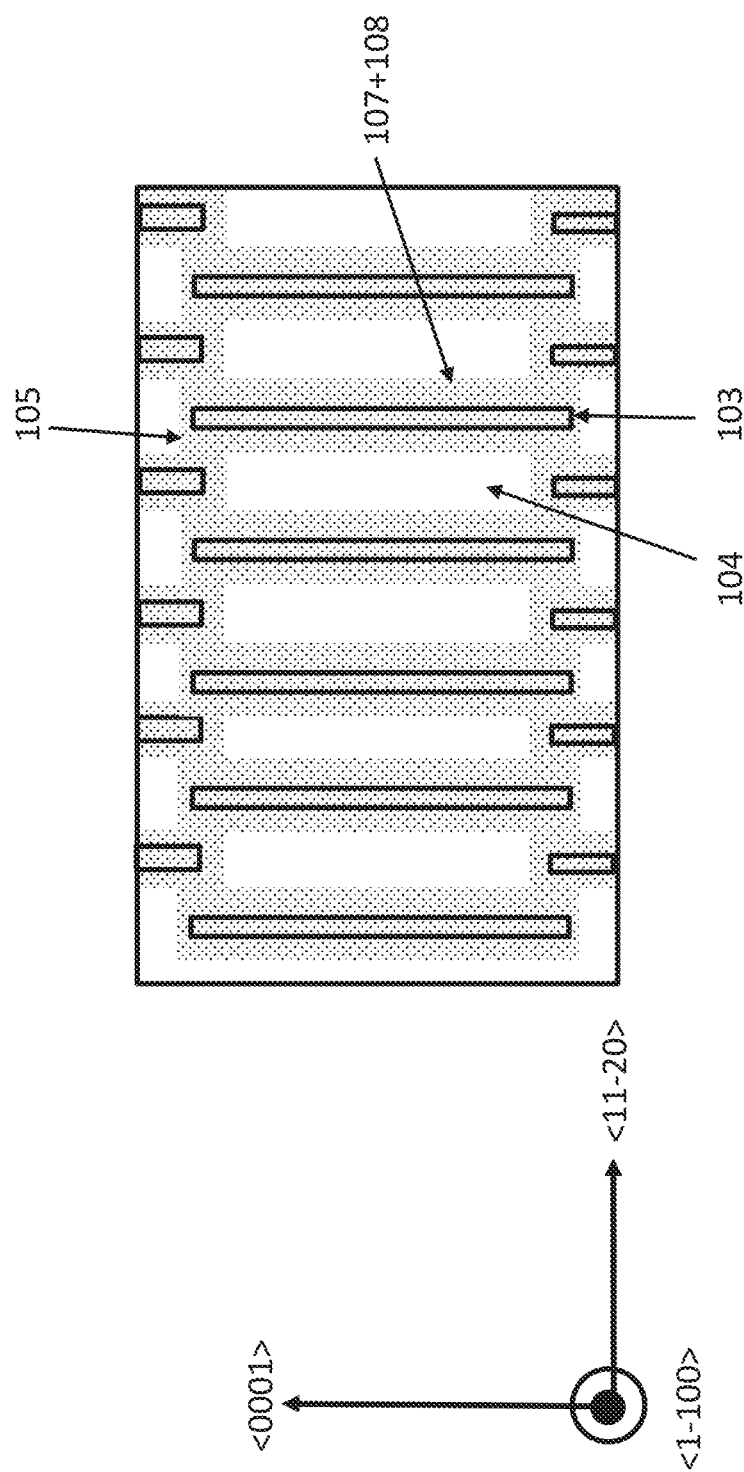

FIGS. 4(a) and 4(b) illustrate the growth of the ELO GaN-based layers 105 using the growth restrict masks 102 of FIGS. 3(a) and 3(b), respectively.

Using the growth restrict mask 102, the ELO GaN-based layers 105 are grown in an island-like shape in the (0001) plane orientation by a vapor-phase deposition method, for example, a MOCVD method.

The surface of the GaN-based substrate 101 is exposed in the opening areas 103 of the growth restrict mask 102, and the ELO GaN-based layers 105 are selectively grown thereon, continuously in both vertical and lateral directions relative to the growth restrict mask 102. The growth is stopped before the ELO GaN-based layers 105 coalesce with adjacent ELO GaN-based layers 105 on the growth restrict mask 102, resulting on no-growth regions 104 between the adjacent ELO GaN-based layers 105.

For (0001) plane growth of a GaN-based semiconductor, the lateral growth rate parallel to the plane is the largest in the 11-20 direction and is the smallest in the 1-100 direction. In the growth restrict mask 102 shown in FIGS. 3(a) and 3(b), as the longitudinal direction of the opening area 103 is the 1-100 direction, the growth rate of the GaN-based semiconductor is small at both ends of the opening area 103, the ELO GaN-based layers 105 opposing each other in the 1-100 direction do not coalesce and remain separated from each other. The length of the ELO GaN-based layers 105 in the 1-100 direction becomes nearly equal with the length a of the opening area 103.

The thickness of the ELO GaN-based layers 105 is important, because it determines the width of one or more flat surface regions 107 and layer bending regions 108 at the edges thereof adjacent the no-growth regions 104. The width of the flat surface region 107 is preferably at least 5 μm, and more preferably is 10 μm or more, and most preferably is 20 μm or more.

The growth ratio of the ELO GaN-based layers 105 is the ratio of the growth rate of the lateral direction parallel to the 11-20 axis of the GaN-based substrate 101 to the growth rate of the vertical direction parallel to the 0001 axis of the GaN-based substrate 101. Preferably, the growth ratio of the ELO GaN-based layers 105 is high, wherein, by optimizing the growth conditions, the growth ratio of the ELO GaN-based layers 105 can be controlled from 0.2 to 4. In the c-plane case, where the ratio of the ELO GaN-based layers 105 is 4, the ELO GaN-based layers 105 are only about 5 μm in thickness, but obtain a width of the flat surface region 107 of 20 μm. On the other hand, in the m-plane case, the ratio of the ELO GaN-based layers 105 is less than the c-plane, e.g., about 0.2-2. The present invention makes it possible to remove the epilayer in both cases.

In order to obtain a high ratio for the ELO GaN-based layers 105, the growth temperature of the ELO GaN-based layers 105 is preferably higher than about 950° C. and the pressure in the MOCVD chamber is preferably lower than about 100 Torr. Also, in order to promote the migration of Ga atoms, the V/III ratio is preferably high.

When the distance between the ELO GaN-based layers 105 on opposing planes with lowest growth rates is large, the following disadvantages occur. In the mask portion of the growth restrict mask 102 at the regions between the ELO GaN-based layers 105 in the 1-100 direction of which the growth rate is the lowest, raw gas is not consumed, and therefore, the gas concentration increases, and a concentration gradient in the 1-100 direction is generated, and by diffusion according to the concentration gradient, a large amount of the gas is supplied at the edge portions in the 1-100 direction of the ELO GaN-based layers 105. As the result, the thickness of the edge portions in the 1-100 direction of the ELO GaN-based layers 105 increases in comparison with other portions, and results in a raised shape. The raised shape causes not only structural inconveniences in the devices, but also creates problems in the following manufacturing processes of photolithography, etc.

To prevent the raised shape, the ELO GaN-based layers 105 come as close as possible, and thus it is necessary not to create in-plane uniformity of the raw gas from the beginning of the growth. In the growth restrict mask 102 shown in FIG. 3(b), the opening areas 103 adjacent to each other in the 11-20 direction are formed in a manner such that the opening areas 103 overlap at opposing end portions for the length q.

As a result, the in-plane uniformity of gas concentration is obtained by consumption of the raw gas caused by growing the ELO GaN-based layers 105. Finally, this results in a uniformity in the thickness of the island-like III-nitride based semiconductor layers 109.

Additional III-Nitride Based Semiconductor Layers

The growth conditions of the additional III-nitride based semiconductor layers 106 can use the same MOCVD conditions as the ELO III-nitride based layers 105. For example, the growth of GaN layers is at the temperature of 950-1150° C. and the pressure of 30 kPa. For the growth of a GaN layers, trimethylgallium (TMGa) and ammonia (NH$_3$) are used as the raw gas, and hydrogen (H$_2$) and nitrogen (N$_2$) are used as the carrier gas; for the growth of an AlGaN layers, triethylaluminium (TMAl) is used as the raw gas; and for the growth of an InGaN layers, trimethylindium (TMIn) is used as the raw gas.

Flat Surface Region

The flat surface region 107 is bounded on both sides by the layer bending regions 108. Furthermore, the flat surface region 107 is on or above the growth restrict mask 102 and the opening areas 103.

Fabrication of the semiconductor devices 110 is mainly performed on the flat surface region 107. The flat surface region 107 has a high uniformity of the thickness of each semiconductor layer 105, 106 in the flat surface region 107.

It is not a problem if the fabrication of the semiconductor device 110 is partially performed on the layer bending region 108. More preferably, the layer bending layer 108 is removed by etching before the device 110 is completed.

Layer Bending Region

Figure 5:
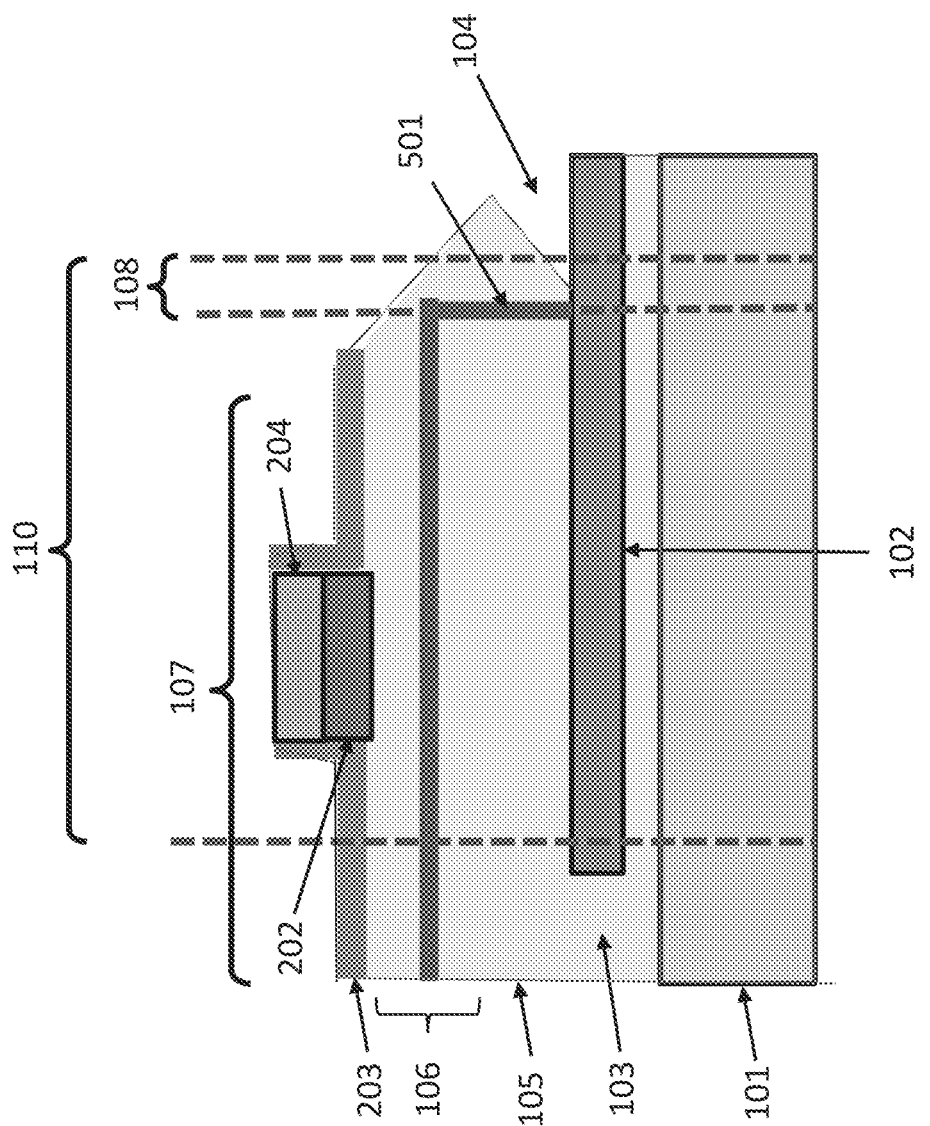
FIG. 5 illustrates a bended active region.

As shown in FIG. 5, the layer bending region 108 may result in a bended active region 501 remaining in the device 110, following growth of the additional III-nitride semiconductor device layers 106.

If the layer bending region 108 that includes a bended active region 501 remains in the device 110 that is an LED chip, a portion of the emitted light from the active region is reabsorbed. As a result, it may be preferable to remove the layer bending region 108.

If the layer bending region 108 that includes a bended active region 501 remains in the device 110 that is an LD chip, the laser mode may be affected by the layer bending region 108 due to a low refractive index (e.g., when it is an InGaN layer). As a result, it may be preferable to remove the layer bending region 108.

If the layer bending region 108 remains in the device 110 that is an LD chip, the edge of a ridge stripe structure should be at least 1 μm or more from the edge of the layer bending region 108.

From another point of view, an epitaxial layer of the flat surface region 107, except for the opening area 103, has a lesser defect density than an epitaxial layer of the opening area 103. Therefore, the ridge stripe structure should be in the flat surface region 107, except for the opening area 103.

Island-Like III-Nitride Based Semiconductor Layers

As noted above, the III-nitride based semiconductor layers include ELO III-nitride based layers 105 and additional III-nitride based semiconductor layers 106, and are collectively referred to as island-like III-nitride based semiconductor layers 109.

The sides of the island-like III-nitride based semiconductor layers 109 are typically formed with the (1-10a) plane (where a is an arbitrary integer), the (11-2b) plane (where b is an arbitrary integer), or planes crystallographically equivalent to these, or the sides of the island-like III-nitride based semiconductor layers include the (1-10a) plane (where a is an arbitrary integer).

The island-like III-nitride based semiconductor layers 109 generally comprise more than two layers, including at least one layer among an n-type layer, an undoped layer and a p-type layer. The island-like III-nitride based semiconductor layers 109 specifically may comprise GaN layers, AlGaN layers, AlGaInN layers, InGaN layers, etc.

In cases where the device 110 has a plurality of the island-like III-nitride based semiconductor layers 109, the distance between the island-like III-nitride based semiconductor layers 109 adjacent to each other is generally 30 μm or less, and preferably 10 μm or less, but is not limited to these values. The distance between the island-like III-nitride based semiconductor layers 109 is preferably the width of the no-growth region 104.

The combined thickness of the ELO GaN-based layers 105 and the additional III-nitride based semiconductor device layers 106 may range from 1 to 70 μm, for example, but is not limited to these values. The combined thickness of the ELO GaN-based layers 105 and additional III-nitride based semiconductor device layers 106 is measured from the surface of growth restrict mask 102 to the upper surface of the additional III-nitride based semiconductor device layers 106.

Devices

The semiconductor devices 110 may comprise, for example, a Schottky diode, a light-emitting diode, a semiconductor laser diode, a photodiode, a transistor, etc., but are not limited to these devices. This invention is particularly useful for micro-LEDs and laser diodes, such as edge-emitting lasers and vertical cavity surface-emitting lasers (VCSELs).

Figure 6:
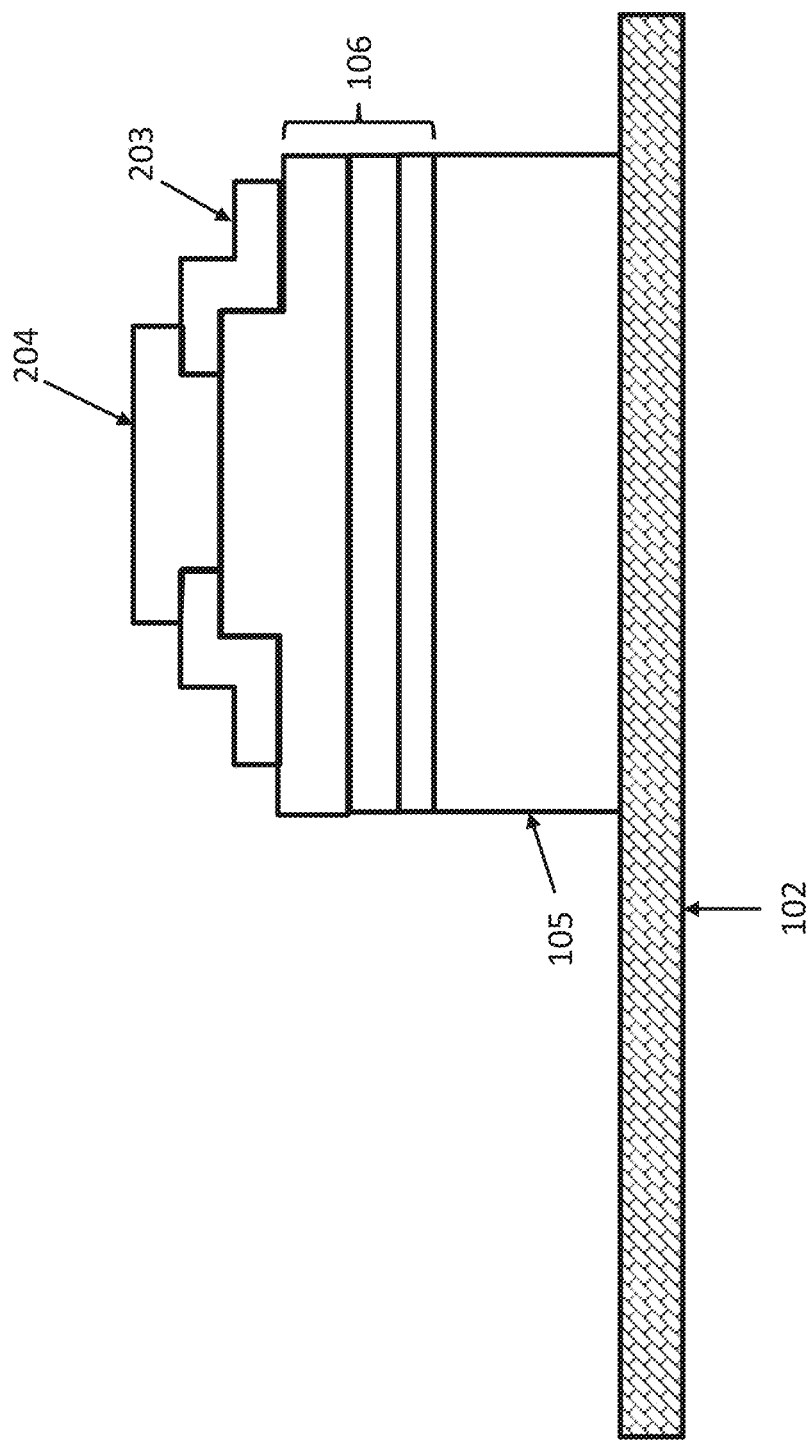
FIG. 6 is a sectional view of the nitride semiconductor laser bar along the direction perpendicular to the optical resonator.

FIG. 6 is a sectional view of one embodiment of the device 110, which in this example comprise a laser diode. Specifically, the III-nitride semiconductor laser diode is comprised of the following layers, laid one on top of another in the order mentioned, the growth restrict mask 102, the ELO GaN-based layers 105, a 5× InGaN/GaN multiple quantum well (MQW) active region 106a, an AlGaN EBL 106b, a p-GaN cladding layer 106c, a ZrO₂ current limiting layer 203, and a p-electrode 204. Note that the semiconductor layers 105, 106 may be formed of any nitride-based III-V group compound semiconductor grown in the above order.

The sectional view of FIG. 6 shows the laser bar along a direction perpendicular to an optical resonator, which is comprised of a ridge stripe structure. The ridge stripe structure is comprised of the p-GaN cladding layer 106c and p-electrode 204, and provides optical confinement in a horizontal direction. The width of the ridge stripe structure is of the order of 1.0 to 20 μm, and typically is 10 μm.

In one embodiment, the p-electrode 204 may be comprised of one or more of the following materials: Pd, Ni, Ti, Pt, Mo, W, Ag, Au, etc. For example, the p-electrode 204 may comprise Pd—Ag—Ni—Au (with thicknesses of 3-50-30-300 nm). These materials may be deposited by electron beam evaporation, sputter, thermal heat evaporation, etc. It can also use an ITO electrode on the p-GaN layer.

Facets

Figure 7B:
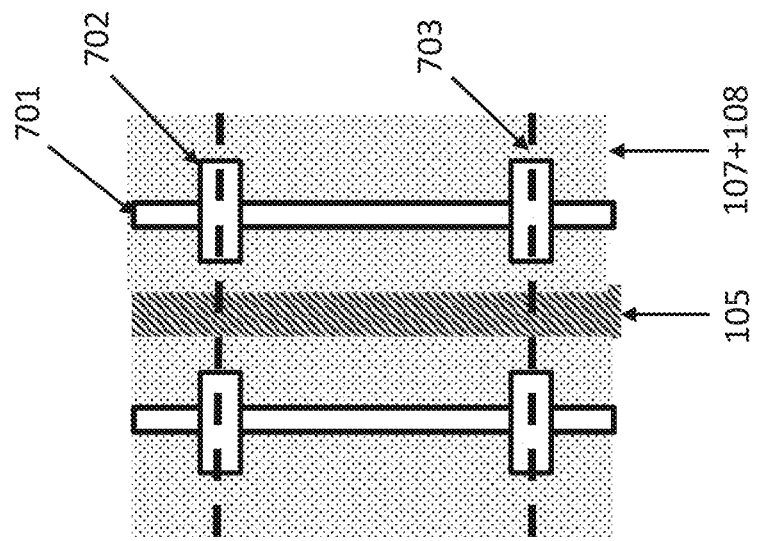

FIGS. 7(a) and 7(b) illustrate the method of making facets for a laser diode device 110.

FIG. 7(a) shows the no-growth region 104, the ELO GaN-based layer 105, the flat surface region 107 and layer bending region 108, based on the growth restrict mask 102 of FIG. 3(a). FIG. 7(b) is an enlarged view of the circled portion of FIG. 7(a), and shows a ridge stripe structure 701 and etched mirror region 702, on the ELO GaN-based layer 105 in FIG. 7(a). The etched mirror region 702 is located based on optical resonance length.

The etching process for GaN etching uses an Ar ion beam and Cl₂ ambient gas. The etching depth is from about 1 μm to about 4 μm. The etched mirror facet 702 may be coated by a dielectric film selected from the group of the following: SiO₂, Al₂O₃, AlN, AlON, SiN, SiON, TiO₂, Ta₂O₅, Nb₂O₅, Zr₂O, etc. The etching process can be adopted for single-layer and multi-layer structures that are selected above materials.

The facets can also be made by a cleaving method, which is utilized for conventional laser diodes.

Support Substrate

The support substrate 201 may be comprised of elemental semiconductor, compound semiconductor, metal, alloy, nitride-based ceramics, oxide-based ceramics, diamond, carbon, plastic, etc., and may comprise a single layer structure, or a multilayer structure made of these materials. A metal, such as solder, etc., or an organic adhesive, may be used for the bonding of the support substrate 201 to the devices 110, and is selected as necessary.

Conventional bonding techniques can be adopted for bonding the support substrate 201 to the devices 110.

In general, the most common types of flip-chip bonding are thermal compression bonding and wafer fusion/bonding. Wafer fusion has been popularly employed in InP-based devices. However, thermal compression bonding is generally much simpler than wafer fusion, as it uses metal-to-metal bonding, and has the benefit of also greatly improving thermal conductivity.

An Au—Au compression bond is by far the simplest bond and results in a fairly strong bond. An Au—Sn eutectic bond offers a much greater bond strength.

It is preferable to perform an activation of the surfaces of the devices 110 before compression bonding. The activation of the surfaces is achieved by using a plasma process of Ar and/or O₂. The III-nitride based devices 110 are then bonded to the support substrate 201 at 150-300° C. under pressure.

Additional Support Substrates

In another embodiment, a second support substrate (not shown) may be used in the removal of the GaN-based substrate 101 from the devices 110. This method comprises the steps of bonding the first support substrate 201 to the exposed surface of the devices 110, and bonding the second support substrate to an exposed surface of the GaN-based substrate 101, before or after removing the GaN-based substrate 101 from the devices 110. Typically, the second support substrate bonded to the GaN-based substrate 101 later can be removed by dissolving low-temperature melted metal and/or solder bonding layers between the second support substrate and the GaN-based substrate 101 using an appropriate etchant.

Like the first support substrate 201, the second support substrate may be comprised of elemental semiconductor, compound semiconductor, metal, alloy, nitride-based ceramics, oxide-based ceramics, diamond, carbon, plastic, etc., and may comprise a single layer structure, or a multilayer structure made of these materials. A metal, such as solder, etc., or an organic adhesive, may be used for the bonding of the second support substrate to the substrate 101, and is selected as necessary.

Substrate Removal

There are two techniques that can be used to remove the GaN-based substrate 101 from the island-like III-nitride based semiconductor layers 109.

One technique is to use just the support substrate 201. The interface between the growth restrict mask 102 and the ELO GaN-based layers 105 has a weak bonding strength. Thus, it is easy to peel the island-like III-nitride based semiconductor layers 109 from the GaN-based substrate 101 using the support substrate 201.

Another technique is to dip the structure into a solvent for wet etching to remove the substrate 101. In one embodiment, the growth restrict mask 102 is SiO₂, which is dissolved using BHF, HF, or another etchant, before removing the GaN-based substrate 101. The merit of this technique is that there is no mechanical damage when the substrate 101 is removed (very gently), and a wide area of SiO₂ is dissolved by the solvent very easily and quickly.

Thereafter, the structure is heated to separate the support substrate 201 and devices 110 from the III-nitride based substrate 101. For example, a Cu support substrate 201 has a larger coefficient of thermal expansion (CTE) than the GaN substrate 101. As shown FIG. 2(e), the more expansion of the support substrate 201 due to heating, the stronger the stress applied to a cleaving point 205. Thereafter, cleaving starts at the cleaving point 205 towards the opposite side of the island-like III-nitride based semiconductor layers 109 for the length of the cleaving surface 206, which is less than the device size 207.

The removal process may also occur when the temperature decreases. It does not matter when the cleaving process starts.

FIG. 8 shows a SEM image of the nonpolar (1-100) m-plane surface of the GaN-based substrate 101 indicated by the dashed circles, after the cleaving has been performed to remove the ELO GaN-based layers 105. FIG. 8 also shows a SEM image of a polar (0001) c-plane surface as a reference. A few atomic steps can be seen on the nonpolar (1-100) m-plane surface; however, it can be seen that the surface morphology of the nonpolar (1-100) m-plane surface after the cleaving has been performed is smoother than the polar (0001) c-plane surface.

Figure 9A:
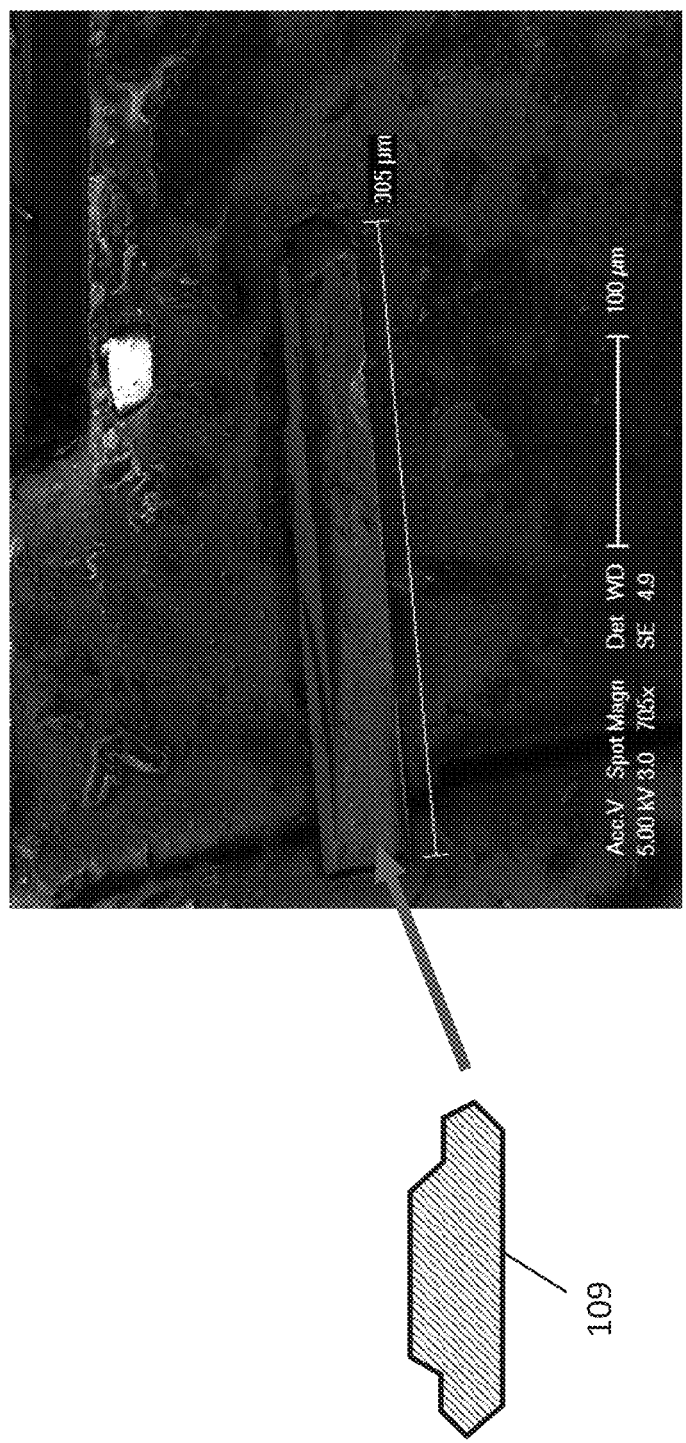

FIG. 9(a) is a SEM image of the island-like III-nitride based semiconductor layers 109, which is a bar with length over 300 μm after being removed from the GaN-based substrate 101. FIG. 9(b) is a SEM image of the cleaving surface 208 of the device 110, following removal of the island-like III-nitride based semiconductor layers 109, wherein the cleaving surface 208 of the device 110 essentially matches the opening area 103 and the cleaving surface 208 has a smooth surface morphology.

FIG. 10(a) illustrates a ±15 degree miscut of a nonpolar (1-100) plane, which results in growth along semipolar (20-21) and (20-2-1) planes, respectively, and FIGS. 10(b), 10(c) and 10(d) are images of the surface of the GaN-based substrate 101 after island-like III-nitride based semiconductor layers 109 grown on a nonpolar (1-100) m-plane, semipolar (20-21) plane, and semipolar (20-2-1) plane, respectively, have been removed.

These SEM images of the cleaving surface 209 of the GaN-based substrate 101 correspond to the opening area 103, which results in very high flatness. Note that there are a higher number of step features on the surfaces of the two semipolar (20-21) and (20-2-1) substrates.

Furthermore, using a surface of a GaN-based substrate 101 that is not m-plane, such as a surface that is a semipolar (20-21), (20-2-1), (30-31), (30-3-1), (1-101), (1-10-1), etc., plane, also results in a cleaving surface 209 that is at least partially a nonpolar (1-100) m-plane.

Figure 10E:
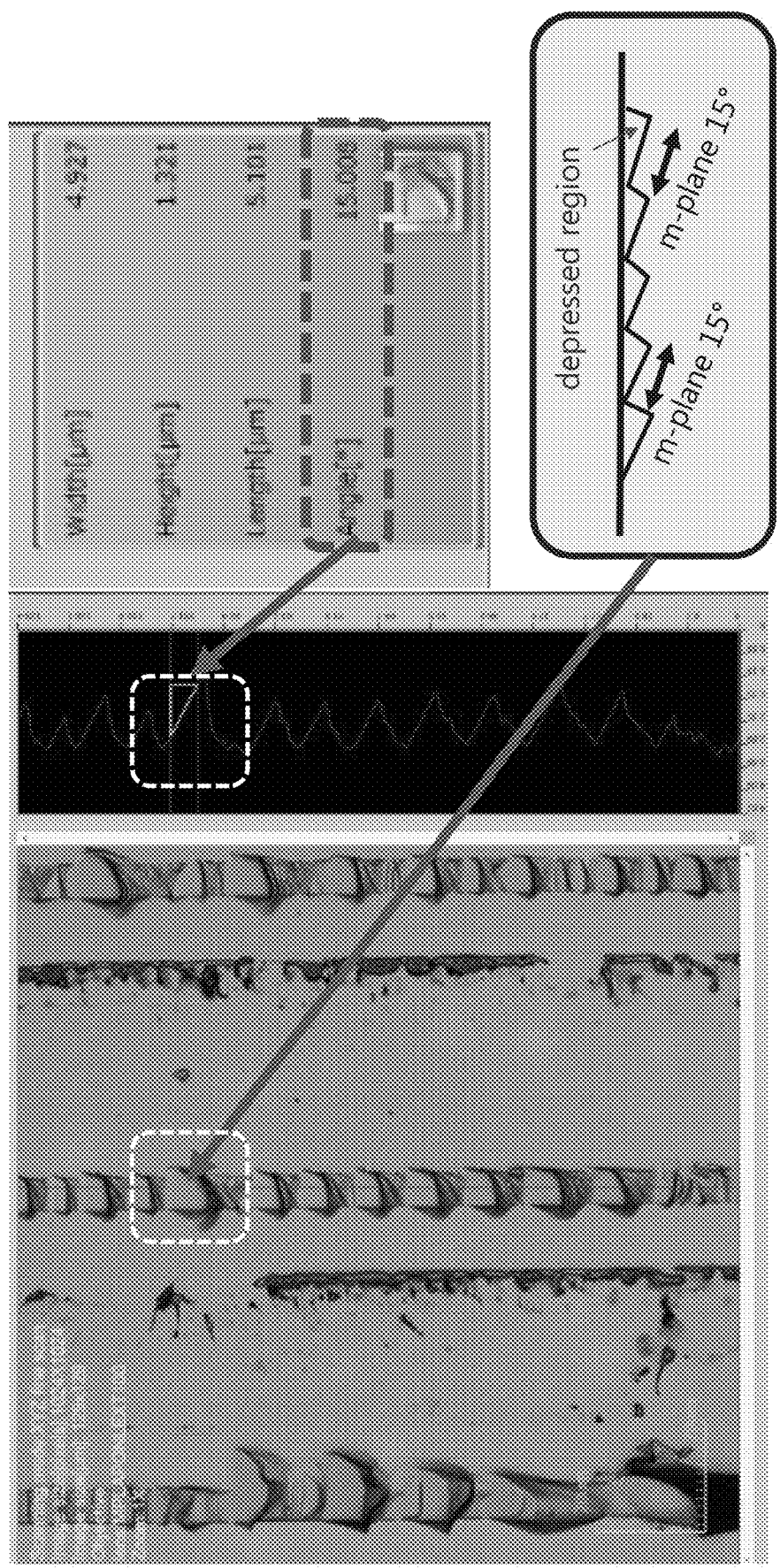

As shown in FIG. 10(e), the cleaved surface angle is measured by laser microscope. In the (20-21) case, the small flat portion shown in this image with an arrow shows an angle of 15°, i.e., (20-21) is inclined 15° from the m-plane, with a fluctuation in the range of about ±3°. Thus, the small flat portion is m-plane. Also, the small flat portion is aligned along the opening area 103. It is easy to remove the semiconductor layers from substrate using cleaving in this case.

Figure 10F:
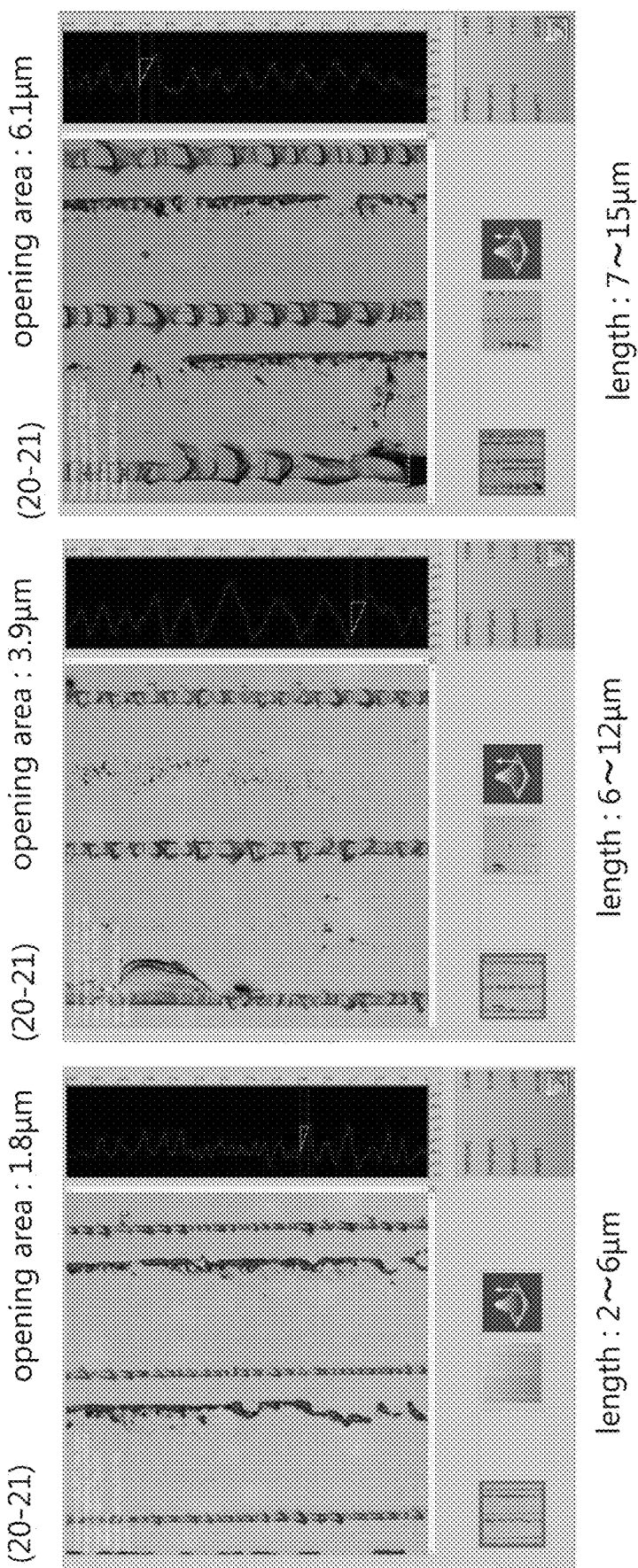

As shown in FIG. 10(f), the size of the small flat portion is changed depending on the width of the opening area 103. When the width of opening area 103 is wider, the length of the small flat portion is longer. Although the width of opening area 103 wider, it can be removed using the same method.

Figure 10G:
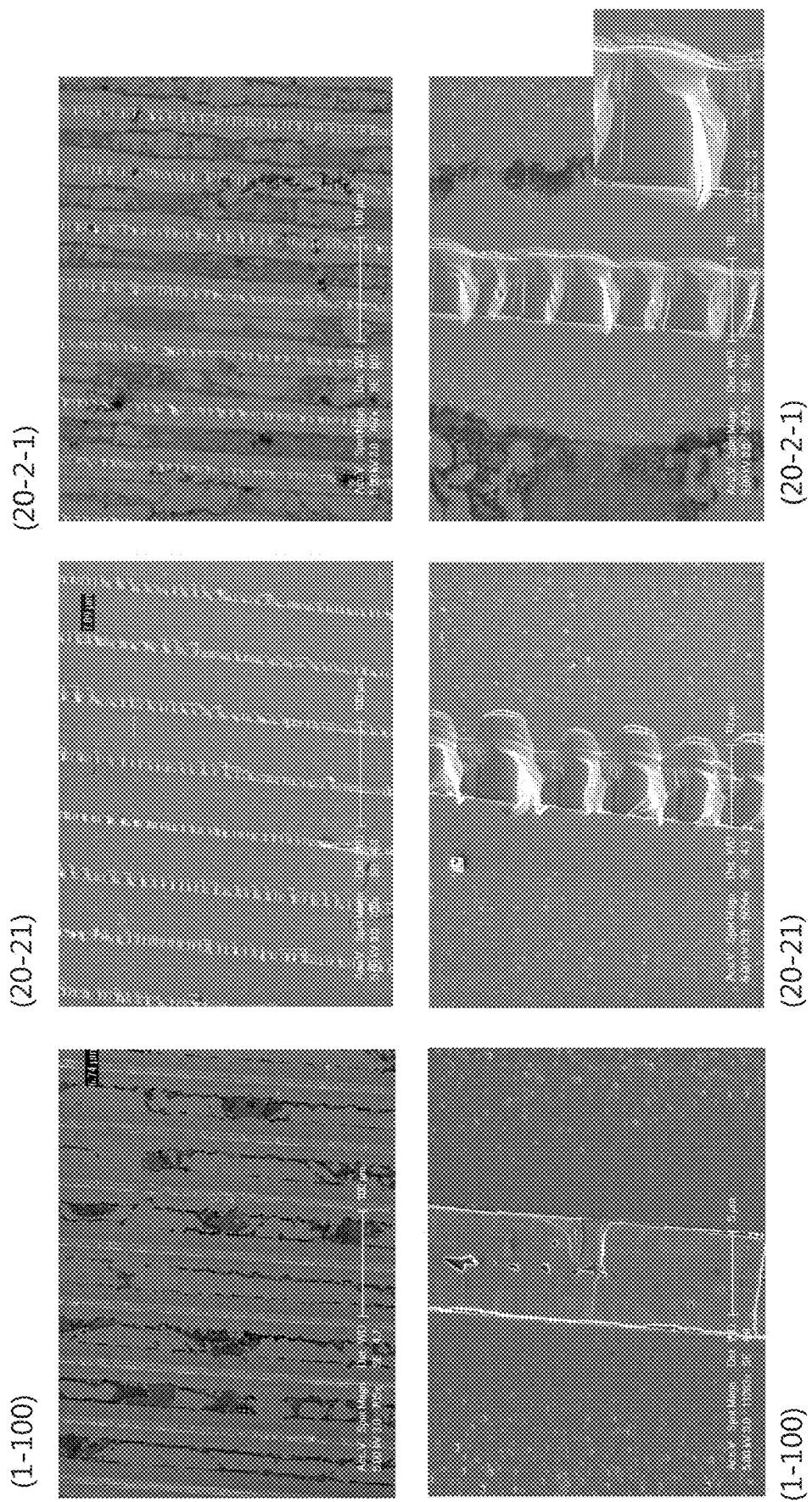

The images in FIG. 10(g) show the cleaved surface of the various planes after removal.

Figure 10H:
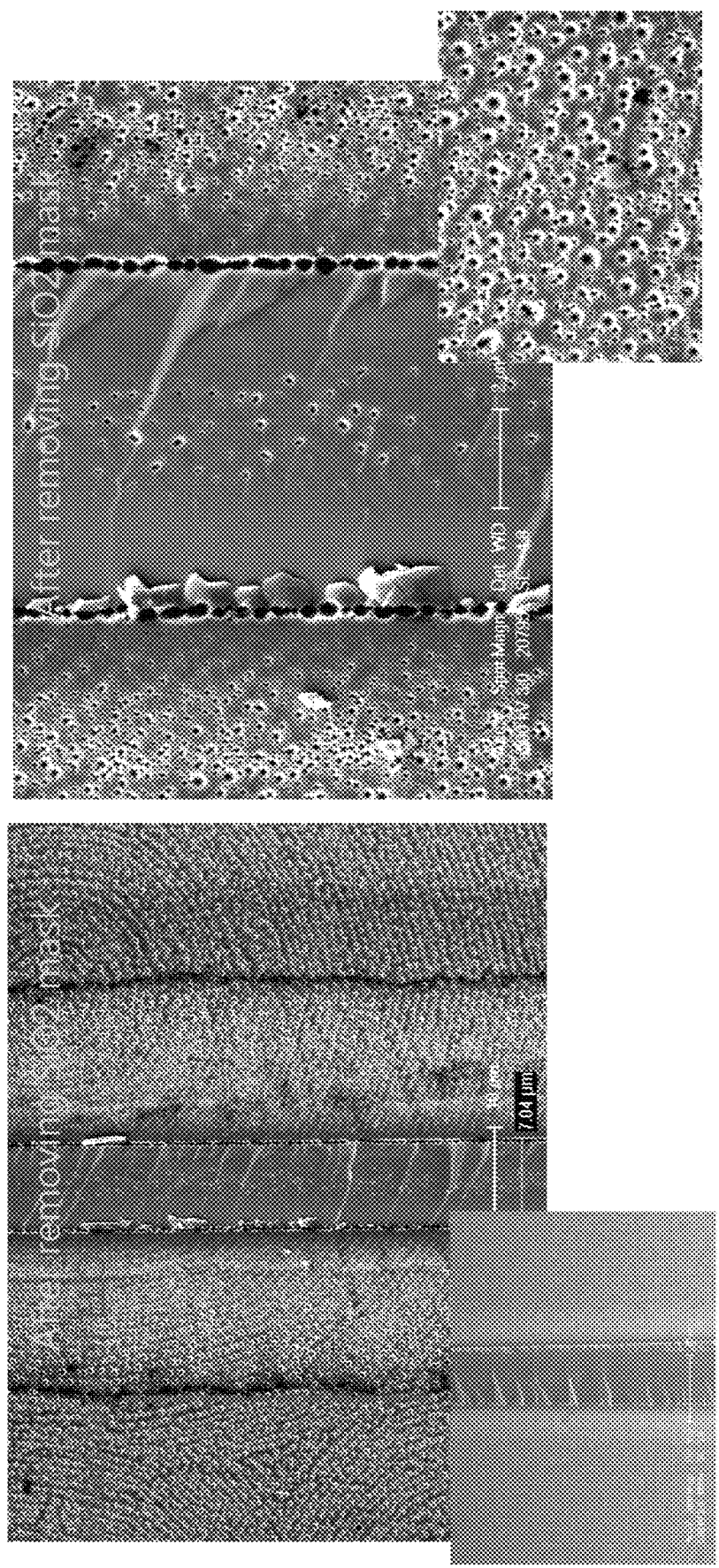

FIG. 10(h) illustrates the use of the polar c-plane surface of the GaN crystal for a cleaving plane. As noted above in FIG. 8, the surface morphology of the nonpolar (1-100) m-plane surface after the cleaving has been performed is smoother than the polar (0001) c-plane surface shown as a reference. Nonetheless, the polar c-plane surface may be used for cleaving, and optimization of the method described herein should improve the surface morphology.

Therefore, even if a GaN-based substrate 101 other than m-plane is used, it is easy to remove the island-like III-nitride based semiconductor layers 109 from the GaN-based substrate 101 using a cleaving technique with a cleaving surface 209 that is an m-plane of the GaN-based substrate 101. The m-plane of III-nitride is a stable plane and easily to cleave. Since island-like III-nitride based semiconductor layers 109 can be cleaved before excessive stress is applied, destruction of the island-like III-nitride based semiconductor layers 109 can be suppressed. Using this method achieves a high yield for removing island-like III-nitride based semiconductor layers 109 from a GaN-based substrate 101.

Moreover, the III-nitride based substrate 101 can be recycled after the island-like III-nitride based semiconductor layers 109 are removed, wherein the surface of substrate 101 may be re-polished by a polisher. The recycling process can be done repeatedly, which lowers the cost of fabricating III-nitride based semiconductor devices.

Support Film

Figure 11A:
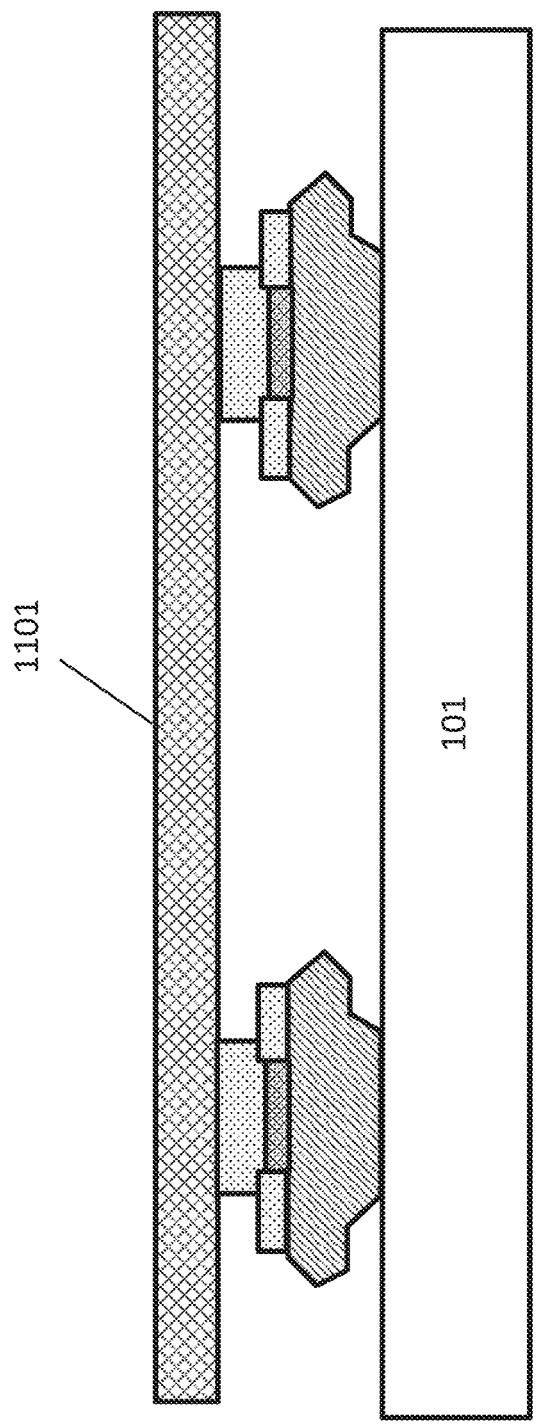
FIGS. 11(a), 11(b) and 11(c) illustrate the use of tape as a support substrate.
Figure 11B:
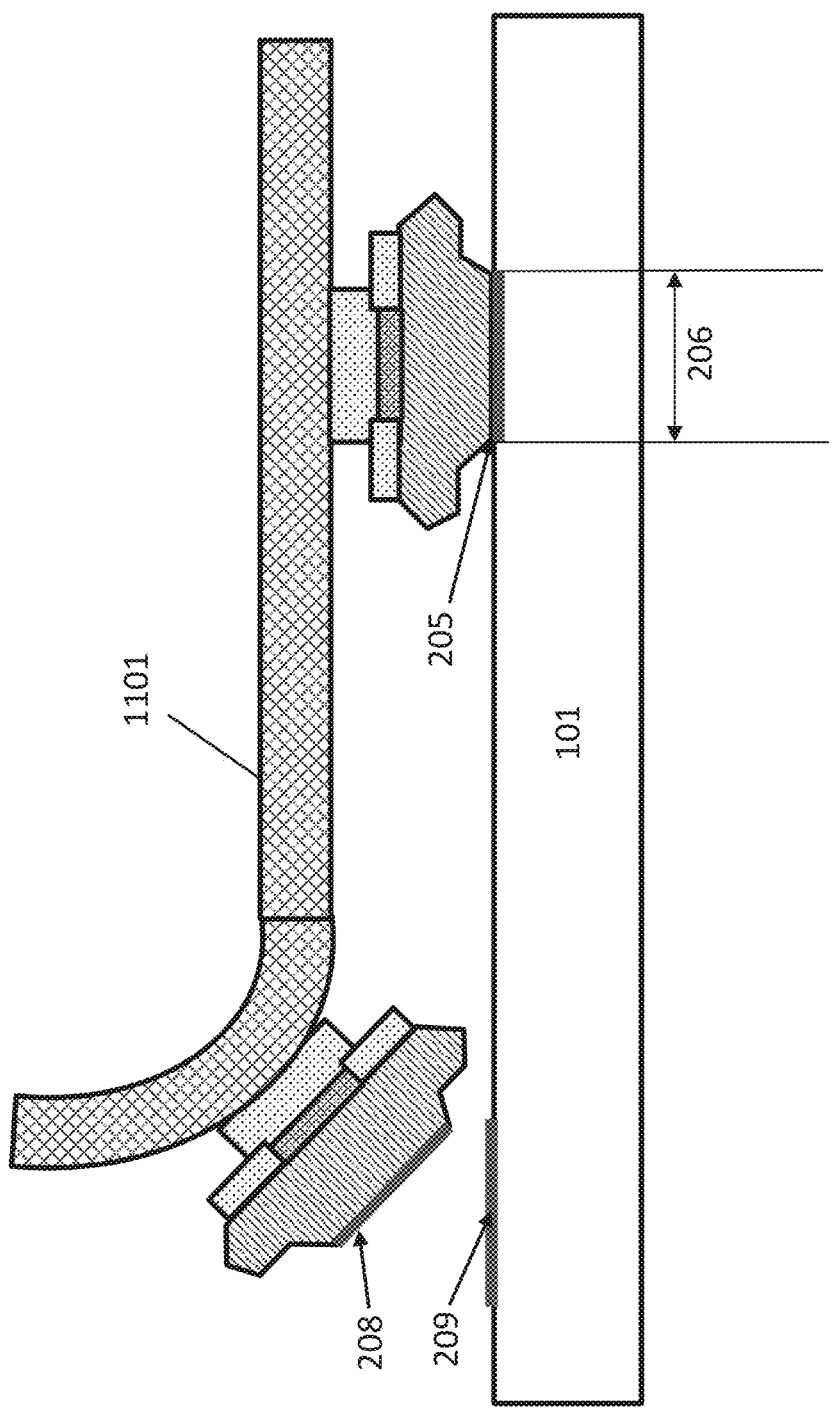

In another embodiment as shown in FIGS. 11(a) and 11(b), a support film 1101 may be used as an alternative to the support substrate 201. In this embodiment, a layer of tape 1101, which may be a polyimide tape, polymer tape, adhesive tape, UV tape, etc., with a thickness of 20-200 μm, is roll-applied to the surface of the p-electrodes layer 204, as shown in FIG. 11(a), and a fracture occurs at the cleaving point 205 upon gently pulling the tape 1101 away from the GaN-based substrate 101 for a cleaving length of 206 to expose cleaving surfaces 208 and 209, as shown in FIG. 11(b). To prevent excessive bending of the island-like III-nitride based semiconductor layers 109 comprising the device 110 after spalling, the outer portions of the tape 1101 may be used to secure the island-like III-nitride based semiconductor layers 109 to a frame (not shown).

Figure 11C:
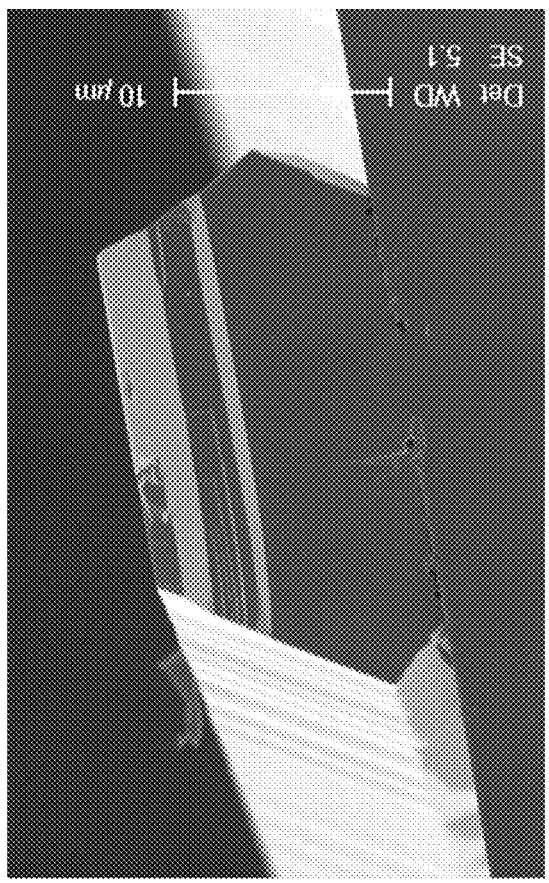

FIG. 11(c) is a SEM image of the island-like III-nitride based semiconductor layers 109 after being removed from the GaN-based substrate 101 using the tape 1101.

In using the support film 1101 to remove the semiconductor layers 109, the temperature cannot exceed, for example, about 150 degrees; otherwise, the support film 1101 may be melted and softened. However, the temperature can be decreased, for example, below about 0 degrees or more, so that the support film 1101 becomes hard and shrinks, which can apply strong stress to the semiconductor layers 109 from the differences in the thermal co-efficient between the semiconductor layers 109 and the support film 1101.

In one embodiment, wherein the support film 1101 is a polymer film, the structure of the polymer film may comprise double or triple layers or more. In one example, the polymer film may have a thickness of about 80 μm, and may be comprised of polyvinyl chloride (PVC). The polymer film may have a backing material, for example, having a thickness of about 38 μm, and may be made of polyethylene terephthalate (P.E.T.). The polymer film may have an adhesive layer, for example, having a thickness of about 15 μm, and may be made of acrylic UV-sensitive adhesive. When the UV-sensitive adhesive is exposed the UV light, the stickiness of the adhesive is drastically reduced. For example, after removing the III-nitride based devices 110 from the substrate 101, the UV-sensitive adhesive may be exposed by the UV light, which makes the support film 1101 easy to remove.

Deposition of n-Electrodes

Referring again to FIG. 2(f), the n-electrode 211 is placed on the back side of the island-like III-nitride based semiconductor layers 109. Typically, the n-electrode 211 is comprised of the following materials: Ti, Hf, Cr, Al, Mo, W, Au, but is not limited these materials.

For example, the n-electrode 211 may be comprised of Ti—Al—Pt—Au (with a thickness of 30-100-30-500 nm), but is not limited to those materials. The deposition of these materials may be performed by electron beam evaporation, sputter, thermal heat evaporation, etc.

Another option is to use ITO and ZnO for the electrode 211, but the electrode 211 is not limited those materials.

Chip Division Method

Referring again to FIGS. 7(a) and 7(b), the chip division method has two steps. The first step is to scribe the island-like III-nitride based semiconductor layers 109. The second step is to divide the support substrate 201 using a laser scribe, etc.

As shown in FIGS. 7(a) and 7(b), the chip scribe line 703 is fabricated by a diamond scribing machine or laser scribe machine. The chip scribe line 703 is fabricated on the back side of the island-like III-nitride based semiconductor layers 109. The chip scribe line 703 may be a solid line or a dashed line.

Next, the support substrate 201 is divided by laser scribing as well to obtain an LD device 110. It is better to avoid the ridge strip structure when the chip scribe line is fabricated.

Second Embodiment

A second embodiment is similar to the first embodiment, except for the plane of the substrate 101. This embodiment is described in terms of using planes other than the nonpolar (1-100) m-plane as the growth surface on the substrate 101. For example, a semipolar substrate 101 having a semipolar (20-21) or (20-2-1) plane as a growth surface may be used, for example, as shown in FIGS. 10(c) and 10(d). Thereafter, the devices 110 are removed from the semipolar substrate 101 using the same method as the first embodiment.

In other embodiments, other planes, such as (30-31), (30-3-1), (10-11), (10-1-1), etc., may be used as well.

This method also can be utilized when a hetero-substrate is used, instead of a III-nitride based substrate 101. The hetero-substrate may include, but is not limited to, sapphire (m-plane), LiAlO$_2$ (LAO), m-plane SiC, Si, etc.

Third Embodiment

A third embodiment is similar to the first embodiment, except for the composition of the ELO III-nitride based layer 105. Specifically, this embodiment uses AlGaN as the ELO III-nitride based layer 105, as shown in FIGS. 12(a)-12(i).

FIGS. 12(a)-12(f) comprise SEM images of stripes along the nonpolar (1-100) plane and the semipolar (20-21) and (20-2-1) planes. All samples shown use a GaN substrate 101. In these examples, the ELO AlGaN layer 105 has a 2-3% Al composition, a thickness of 8-12 μm, and no cracks after being grown.

Figure 12G:
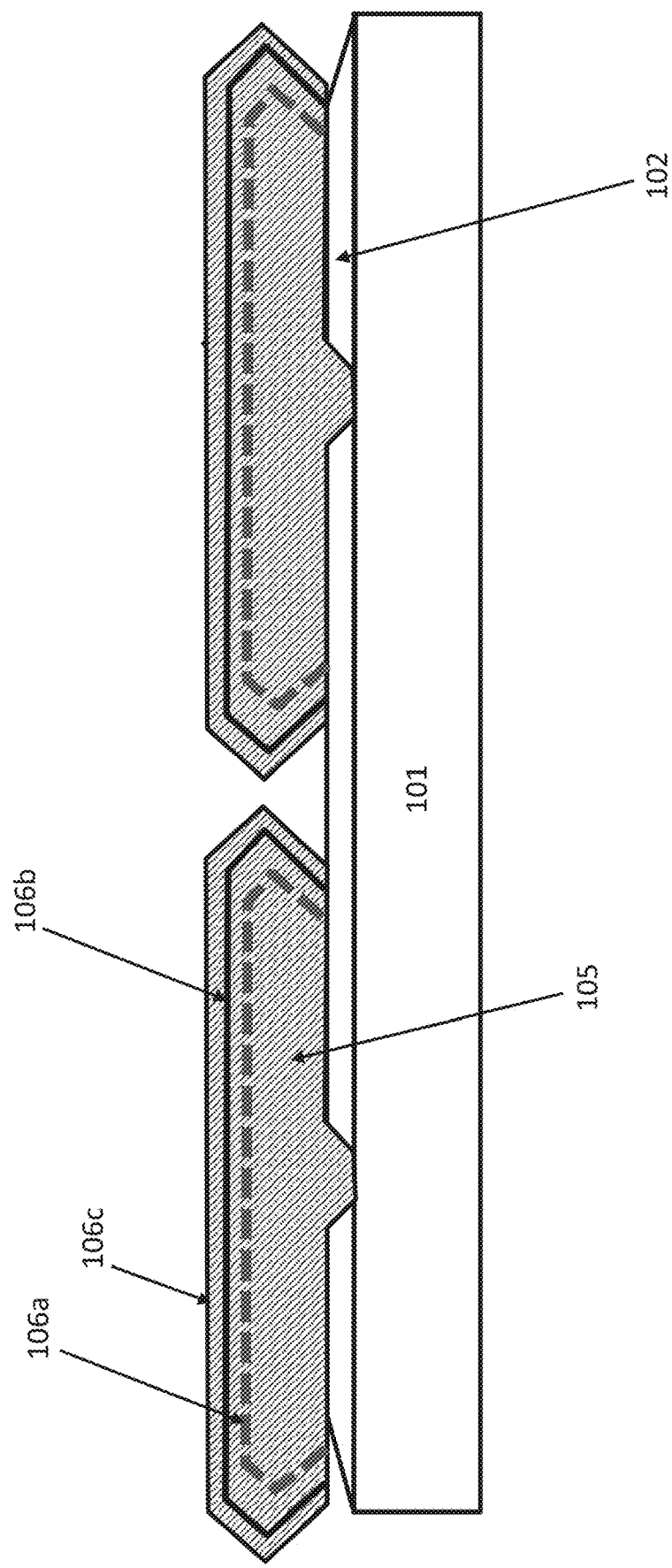

FIG. 12(g) is a schematic of a structure used for a near-UV LED device, including an m-plane GaN substrate 101, growth restrict mask 102, and ELO n-AlGaN layers 105. The device structure also includes an active region 106a, electron blocking layer 106b and p-AlGaN cladding layer 106c.

Figure 12H:
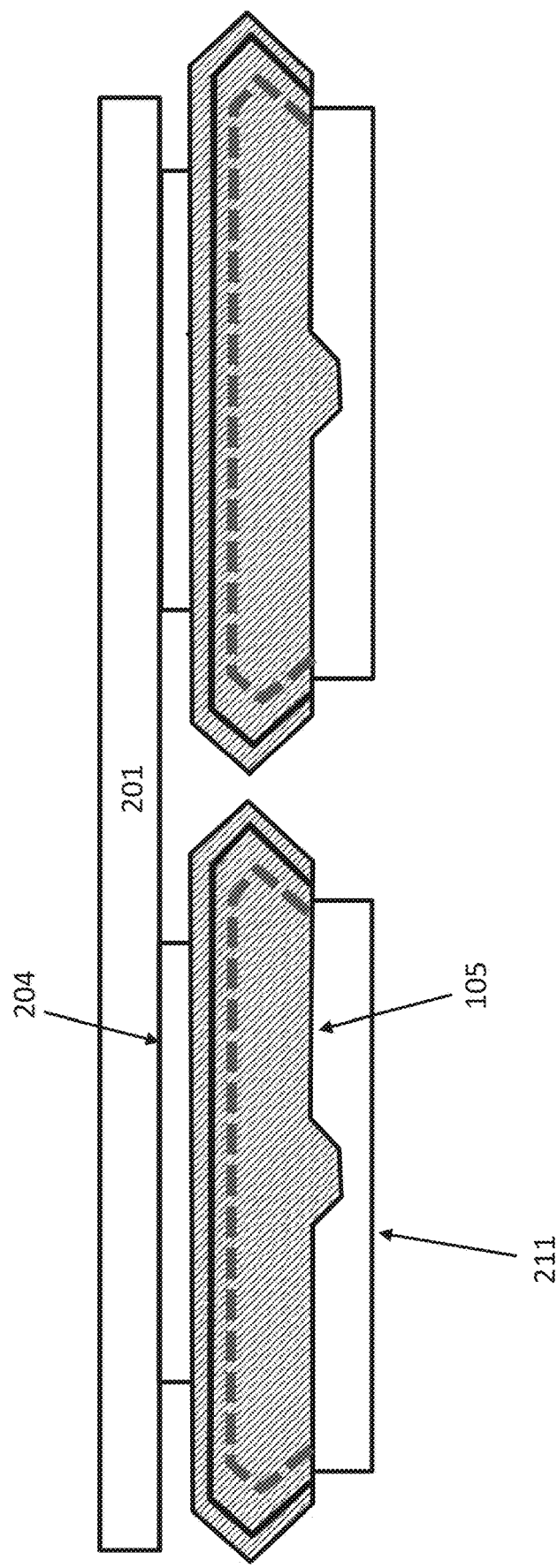

FIG. 12(h) is a schematic of the structure of FIG. 12(g) after removing the GaN based substrate 101 and depositing the n-electrode 211. This embodiment can utilize a high quality and low defect density GaN-based substrate 101 and the ELO n-AlGaN layers 105 to obtain low defect density and high crystal quality semiconductor layers 105, 106.

By using m-plane cleaving, the GaN-based substrate 101 then can be removed from the near-UV device 110. This is preferred with near-UV or UV devices, because a GaN-based substrate 101 absorbs UV light.

Figure 12I:
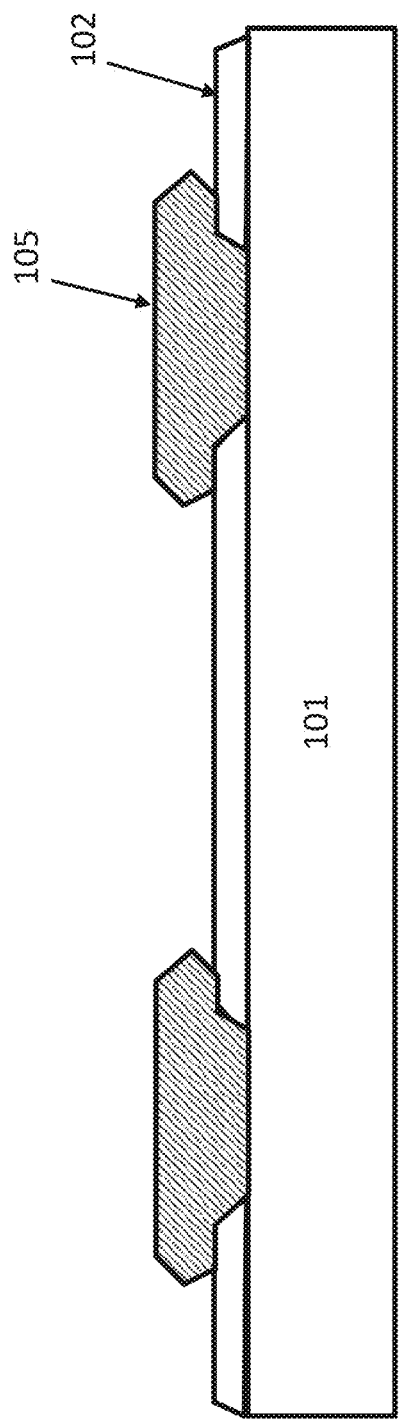

FIG. 12(i) is a schematic of the ELO AlGaN layers 105 grown using a growth restrict mask 102 comprised of SiN on an m-plane AlN-based substrate 101. In this case, the ELO AlGaN layers 105 have a high Al content.

Since the ELO AlGaN layers 105 do not coalesce, strain which is applied from the difference in thermal expansion is efficiently released by the ELO AlGaN layers 105. Thereafter, the island-like AlGaN layers 109 (not shown) can be removed at an interface of the ELO AlGaN layers 105, for example, with an AlGaN/GaN substrate 101.

The ELO AlGaN layers 105 would be useful for near-UV or deep-UV LEDs. However, a GaN-based substrate 101 would absorb light that is shorter than 365 nm, due to the band-gap of GaN, and thus would not be suitable for near-UV and deep-UV LEDs. Since this method can remove the GaN-based substrate 101, which absorbs UV light, this would be suitable for UV and near-UV LEDs. Further, this method can be utilized with an AlN-based substrate 101, which would be suitable for a deep-UV LED.

Fourth Embodiment

Figure 13A:
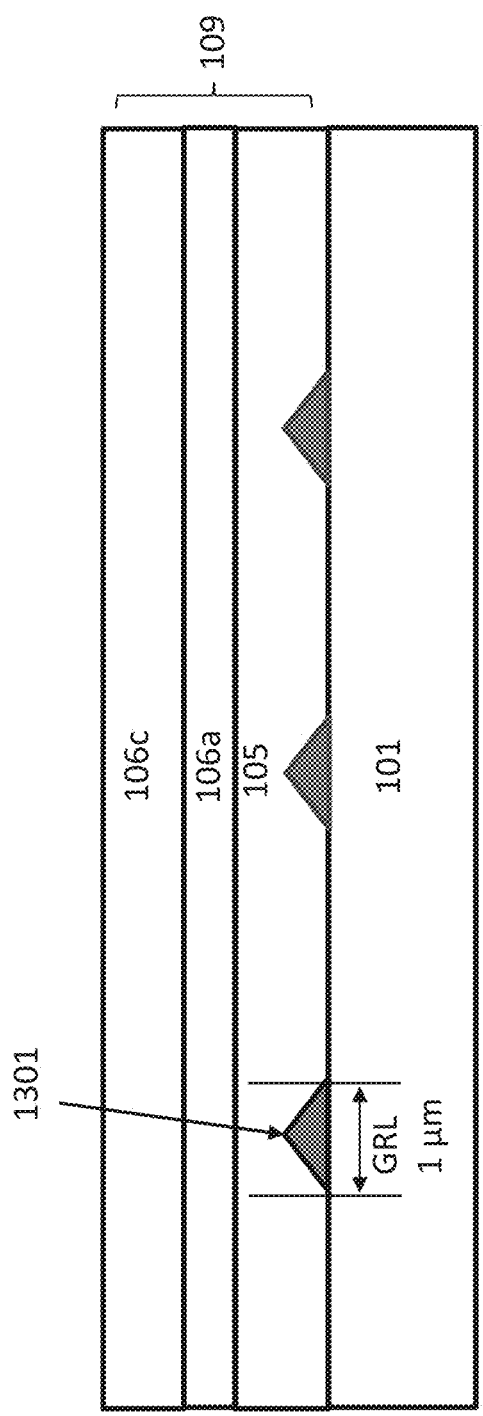
FIGS. 13(a), 13(b) and 13(c) illustrate ELO III-nitride layers that coalesce with each other.
Figure 13B:
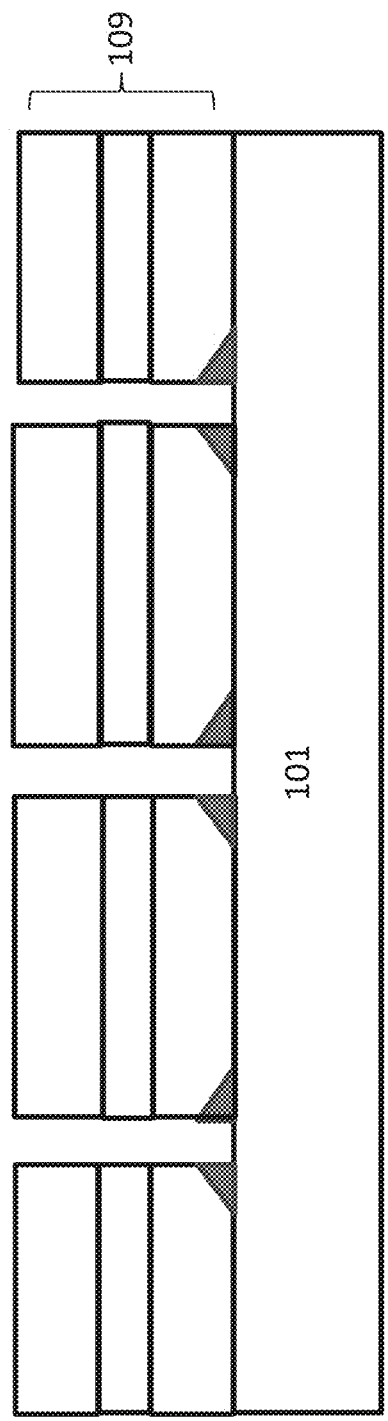
Figure 13C:
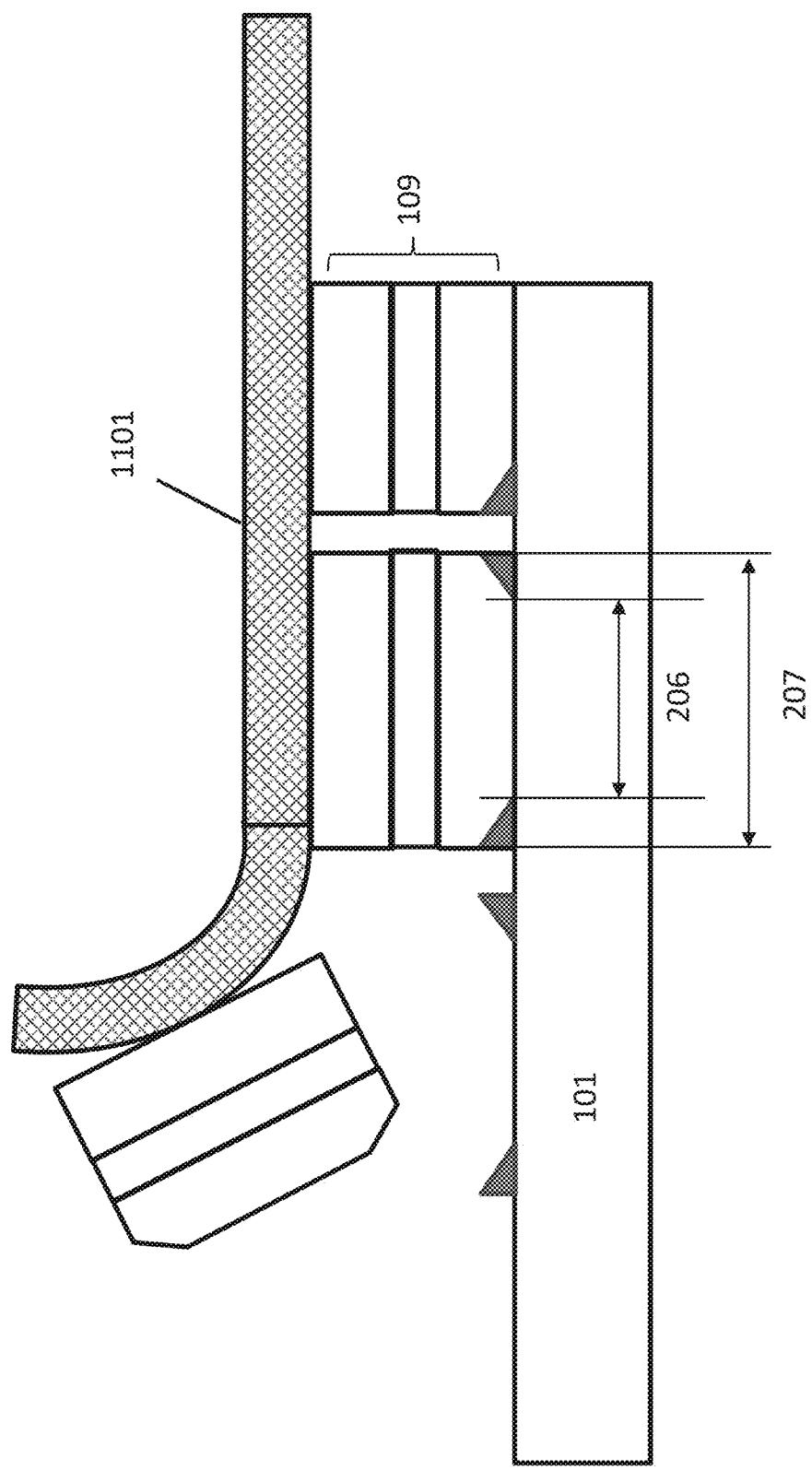

A fourth embodiment differs from the first embodiment in that the ELO III-nitride layers 105 coalesce with each other. The process steps are shown in FIGS. 13(a), 13(b) and 13(c), wherein the island-like III-nitride based semiconductor layers 109 are comprised of at least ELO GaN-based layers 105, a III-nitride active region 106a, and a p-AlInGaN layer 106c deposited on an m-plane GaN substrate 101.

This embodiment uses a growth restrict layer (GRL) 1301 of small size, e.g., less than or equal to 1 μm, which is a variant of the growth restrict mask 102, because it is easy to bury the GRL 1301. Thicker ELO GaN-based layers 105 are necessary to bury a GRL 1301 of larger size, e.g., greater than 1 μm The GRL 1301 of small size may have following dimensions: width is about 0.8-5 μm and thickness is about 0.1-1 μm. By forming the GRL 1301 of small size, the thickness of the ELO GaN-based layers 105 can be made as thin as 1 μm or less.

Figure 14:
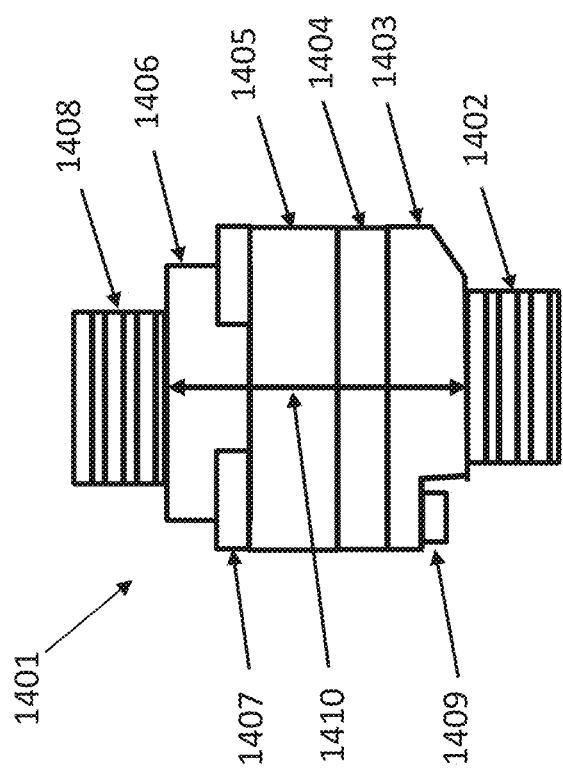
FIG. 14 is a schematic of a vertical cavity surface emitting laser (VCSEL).

A thin ELO GaN-based layer 105 is useful for VCSELs and other devices. For example, the VCSEL 1401 of FIG. 14 is comprised of a first distributed Bragg reflector (DBR1) 1402, ELO GaN-based layers 1403, active region 1404, p-AlInGaN layers 1405, SiO$_2$ layer 1406, ITO layer 1407, second DBR2 1408 and n-electrode 1409. Moreover, the VCSEL 1401 has a cavity length 1410 that is preferably short in order to avoid large optical loss.

In this regard, the opening area 103 is extremely flat due to the cleaving technique. A very flat surface is required where a DBR is deposited. Utilizing cleavability of the m-plane is preferable. Therefore, it is preferable that the location for depositing the DBR should include at least a part of the cleaving surface 205.

Before cleaving, it may be better to etch the island-like III-nitride based semiconductor layers 109, as described in FIG. 13(b). In this example, the etch has exposed the GRL 1301. Laser ablation can also be used to expose the GRL 1301.

Using this embodiment, the island-like III-nitride based semiconductor layers 109 can be removed from the GaN-based substrate 101 in an easy manner. As shown in FIG. 13(c), tape 1101 can be used when removing the epitaxial layers 109. Thereafter, as shown in FIG. 14, the VCSEL 1401 can be fabricated by conventional methods.

Fifth Embodiment

A fifth embodiment is similar to the fourth embodiment, except without using a GRL 1301 or ELO III-nitride based layers 105. The process steps are shown FIGS. 15(a), 15(b) 15(c), 15(d), 15(e) and 15(f).

Figure 15A:
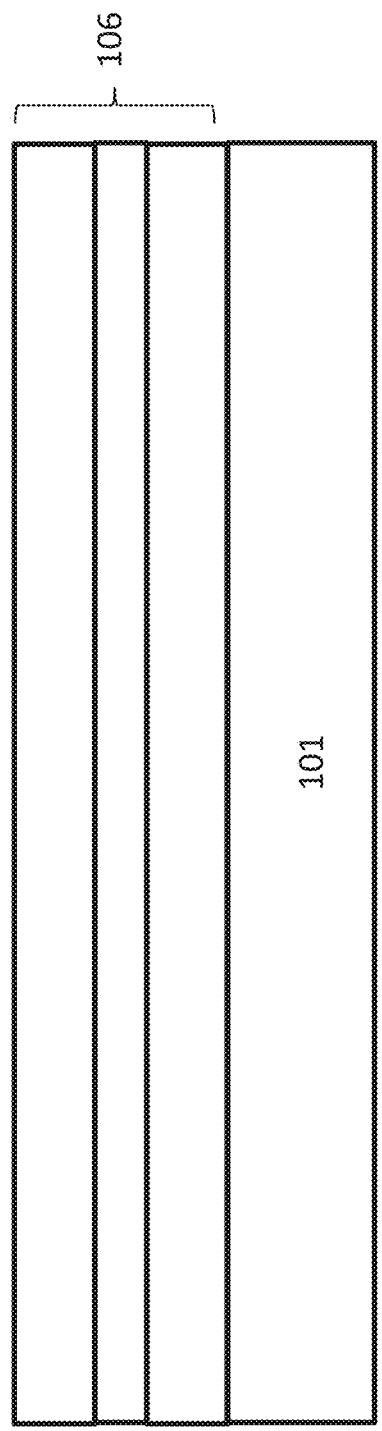
FIGS. 15(a), 15(b), 15(c), 15(d), 15(e) and 15(f) illustrate a cleaving technique using angled etching.
Figure 15B:
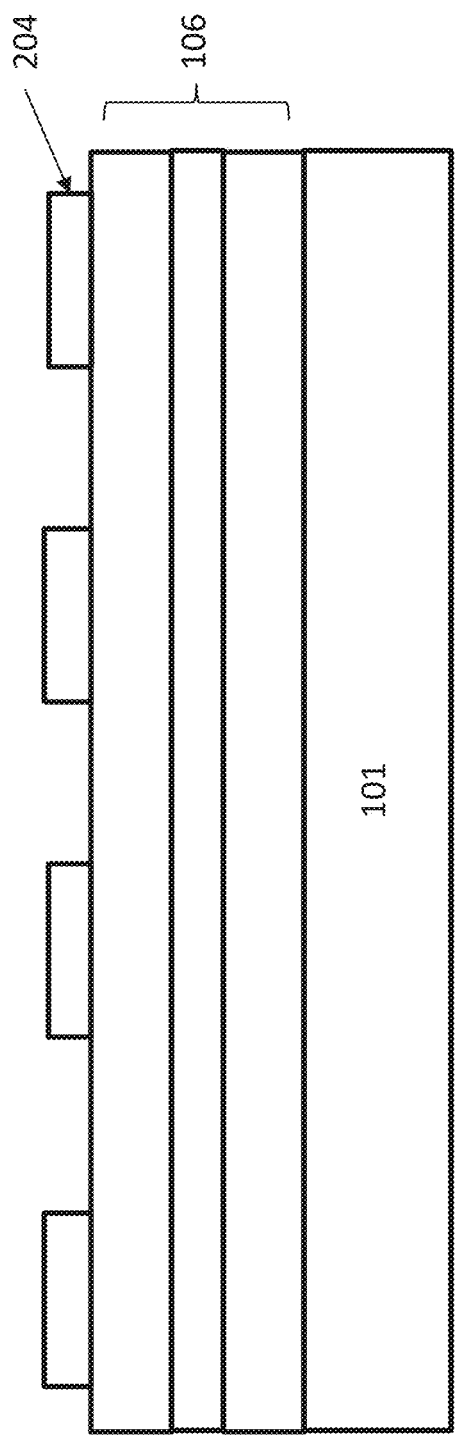
Figure 15C:
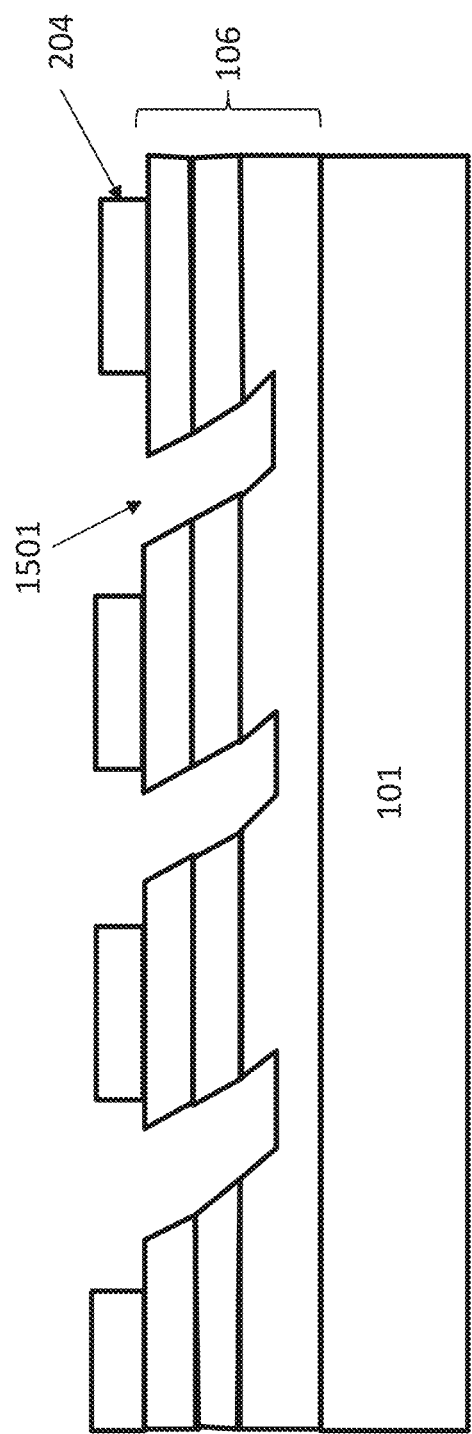
Figure 15D:
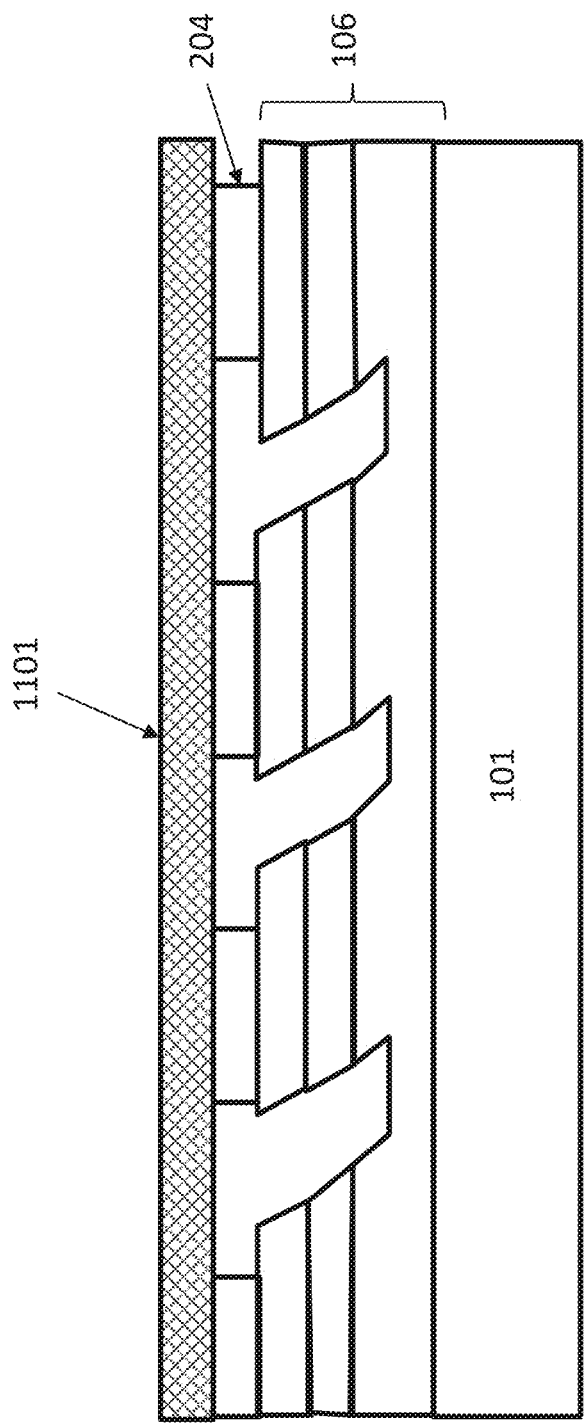
Figure 15E:
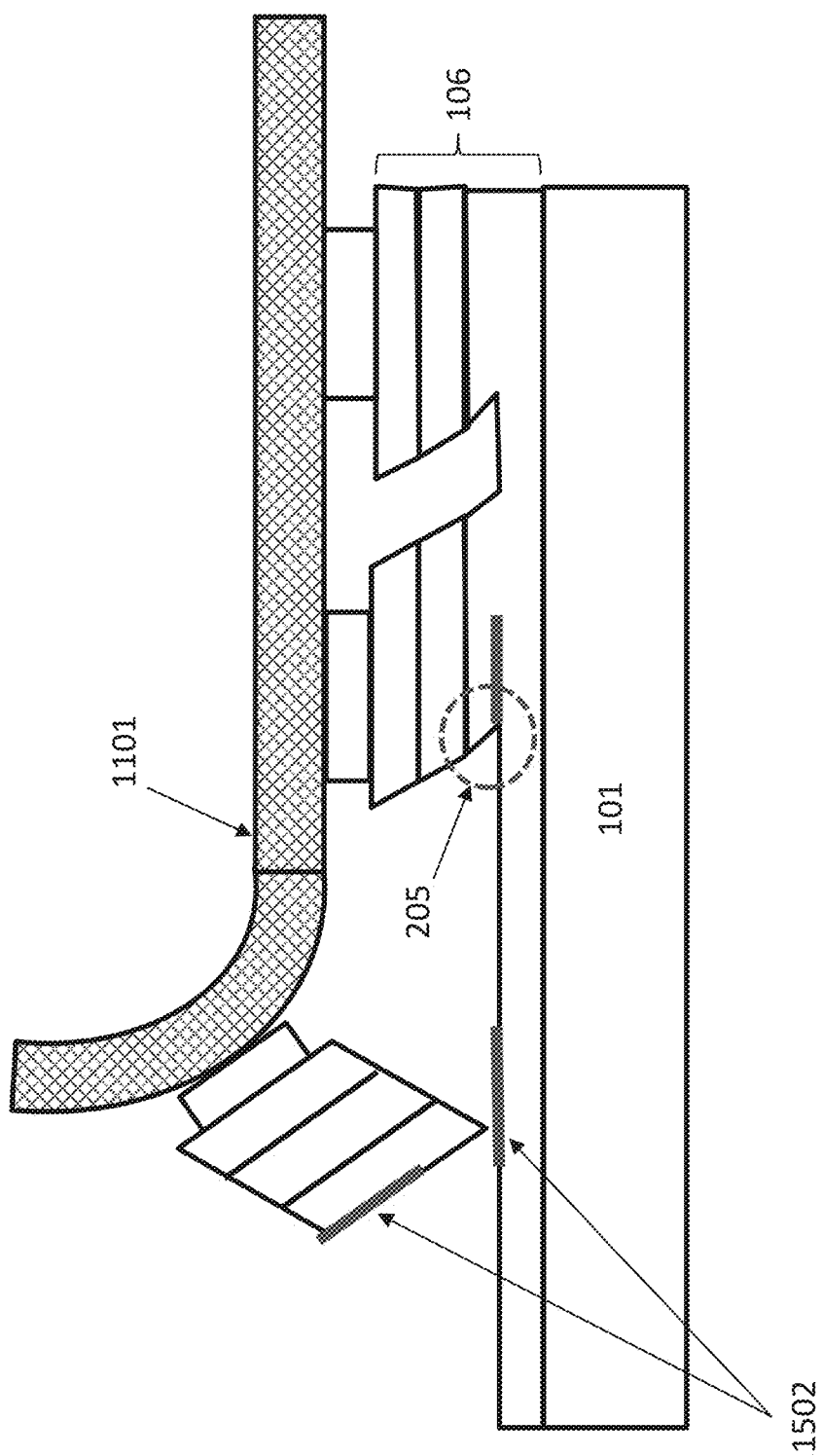

After growing the III-nitride based semiconductor layers 106 on an m-plane surface of the GaN-based substrate 101, as shown in FIG. 15(a). The p-electrodes 204 are deposited on the III-nitride based semiconductor layers 106, as shown in FIG. 15(b). The III-nitride based semiconductor layers 106 are etched 1501, as shown in FIG. 15(c). The tape 1101 is attached to the p-electrodes 204, as shown in FIG. 15(d), and the III-nitride based semiconductor layers 106 are removed from the substrate 101 by peeling the tape 1101 at the cleaving point 205, as shown in FIG. 15(e). By forming such a structure, a strong strain concentration 1502 is applied to the cleaving point 205 shown in FIG. 15(e).

Figure 15F:
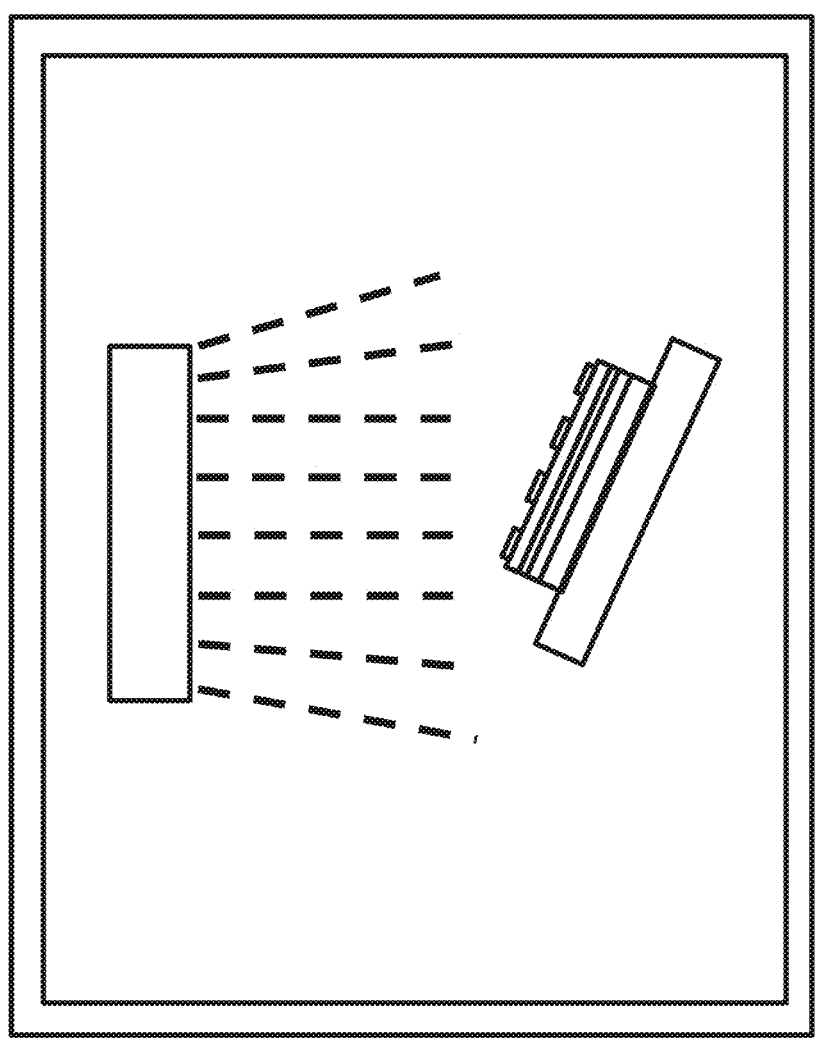

In order to obtain a high yield when removing the GaN-based substrate 101, an angled dry etching 1501 can be used, as shown in FIGS. 15(c), 15(d) and 15(e). The angled dry etching 1501 can be performed by positioning the structure in a tilted manner in a dry etching chamber, as shown in FIG. 15(f).

This embodiment is very useful for a VCSEL, dual dielectric cladding laser, etc., because this method can determine a cleaving point 205 by the depth of the etching 1501.

Sixth Embodiment

A sixth embodiment is similar to the first, second, and third embodiments, except for the shape of the opening area 103. This embodiment is used to fabricate micro-LEDs.

Figure 16A:
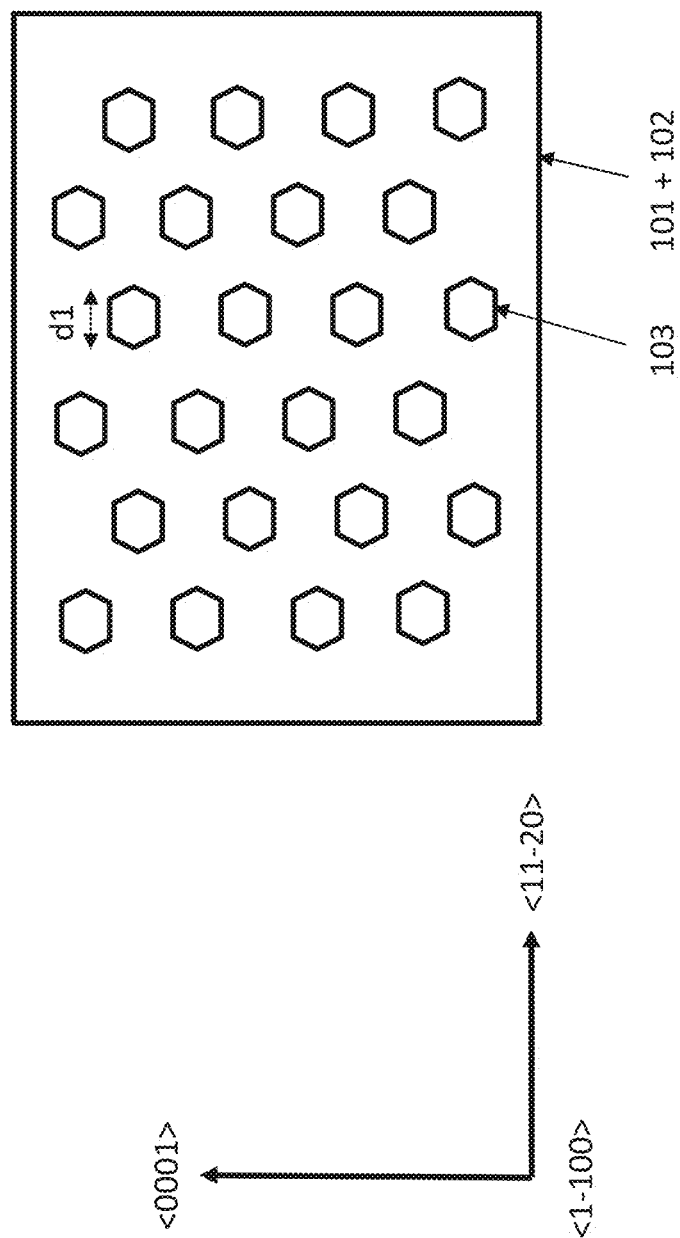
FIGS. 16(a) and 16(b) illustrate the use of patterned substrates for fabricating micro-LEDs.
Figure 16B:
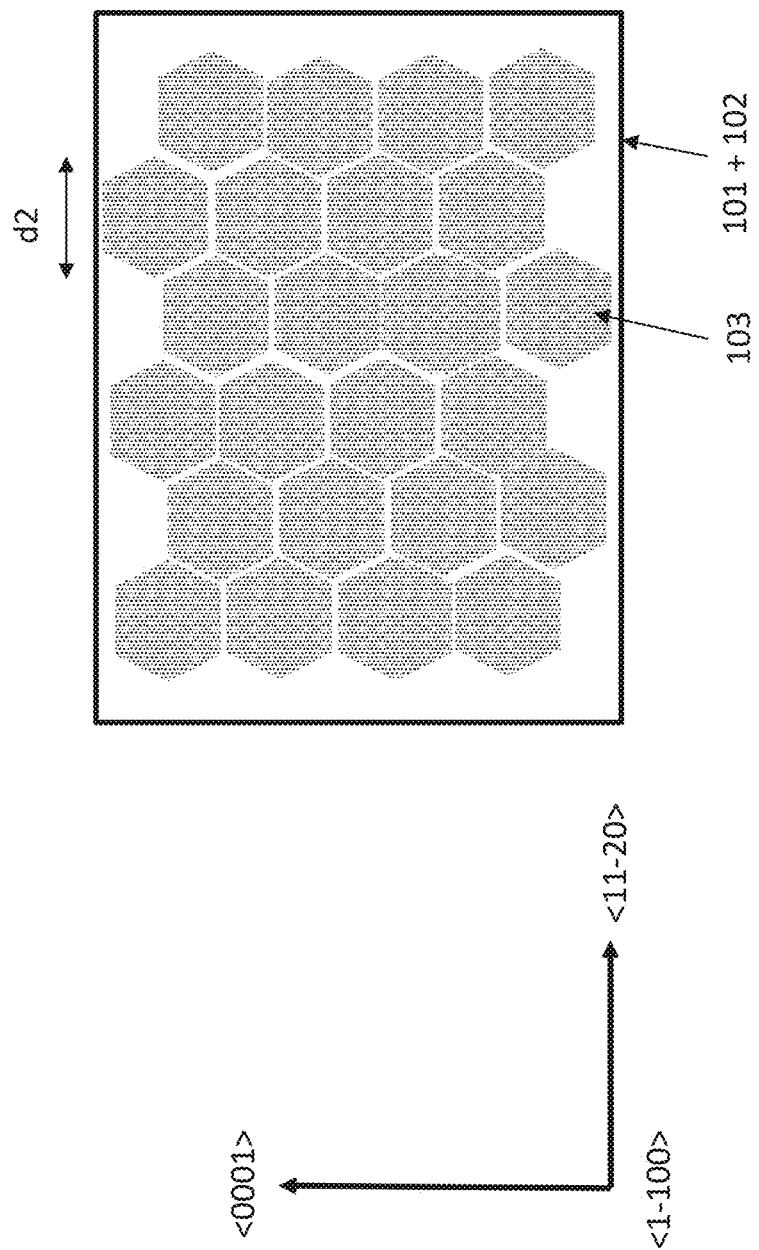

Patterned substrates 101 are shown FIGS. 16(a) and 16(b). The patterned substrates 101 can include small size opening areas 103, such as hexagonal holes, or other shapes, such as circular, triangular, rectangular, etc., holes. In this example, the patterned substrates 101 are obtained using a growth restrict mask 102 with a plurality of openings 103.

FIG. 16(a) illustrates the diameter d1 of the opening areas 103 (i.e., of the hexagonal shape forming the opening) in one embodiment. In this embodiment, the value of d1 is 0.5-20 μm, and more preferably, the value for d1 is about 2 μm.

FIG. 16(b) illustrates the diameter d2 of the opening areas 103 (i.e., of the hexagonal shape forming the opening) in another embodiment. In this embodiment, the value of d2 is 5-60 μm, and more preferably, the value for d1 is about 15 μm.

An LED fabrication process can be used in the method which describes the above embodiment.

Seventh Embodiment

A seventh embodiment is similar to the third embodiment, except for the use of a photo-electro-chemical (PEC) etching technique. This embodiment is illustrated in FIGS. 17(a)-17(f), which describe a method for manufacturing a semiconductor device comprising the steps of: providing a III-nitride substrate 101; growing one or more InAlGaN-based layers 1701 on the III-nitride based substrate 101; growing one or more InAlGaN sacrificial layers 1702 on the InAlGaN-based layers 1701; growing one or more additional InAlGaN-based semiconductor layers 1703, 1704 and 1705 to form a semiconductor device 110; processing the devices 110; etching the InAlGaN-based layers 1701 to expose the InAlGaN sacrificial layers 1702; forming an undercut notch 1706 in the sacrificial InAlGaN layers 1702; bonding the InAlGaN-based layers 1703, 1704, 1705 to a support substrate 201; and removing the III-nitride substrate 101 by cleaving.

Figure 17A:
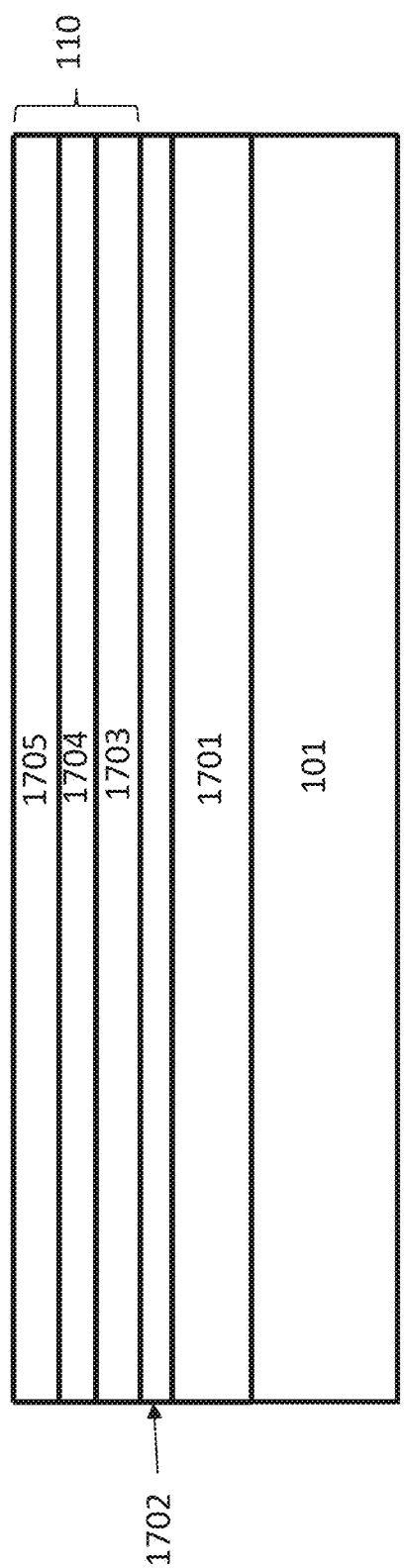
FIGS. 17(a), 17(b), 17(c), 17(d), 17(e) and 17(f) illustrate the use of photoelectrochemical (PEC) etching in the removal of semiconductor layers.
Figure 17B:
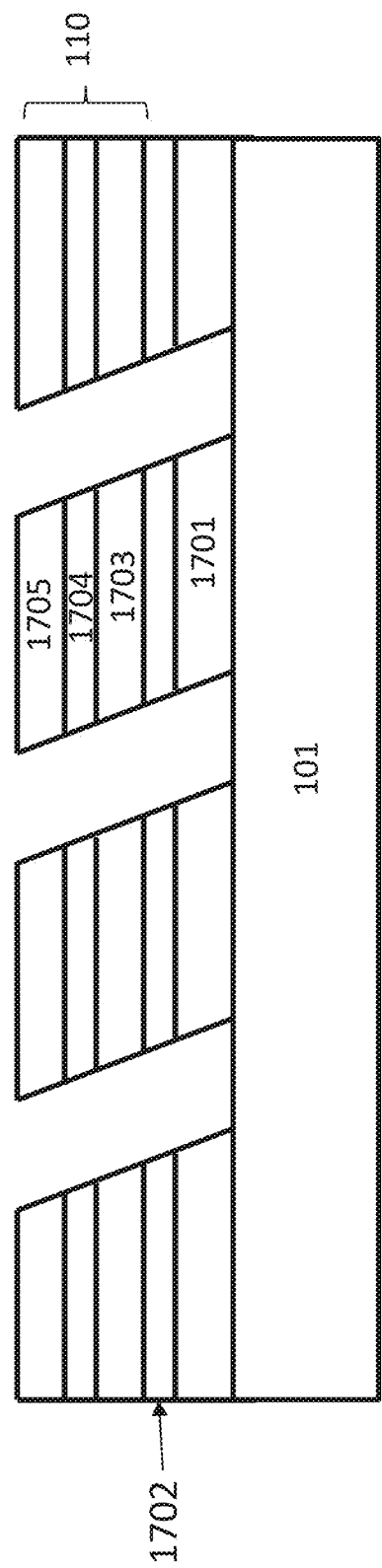
Figure 17C:
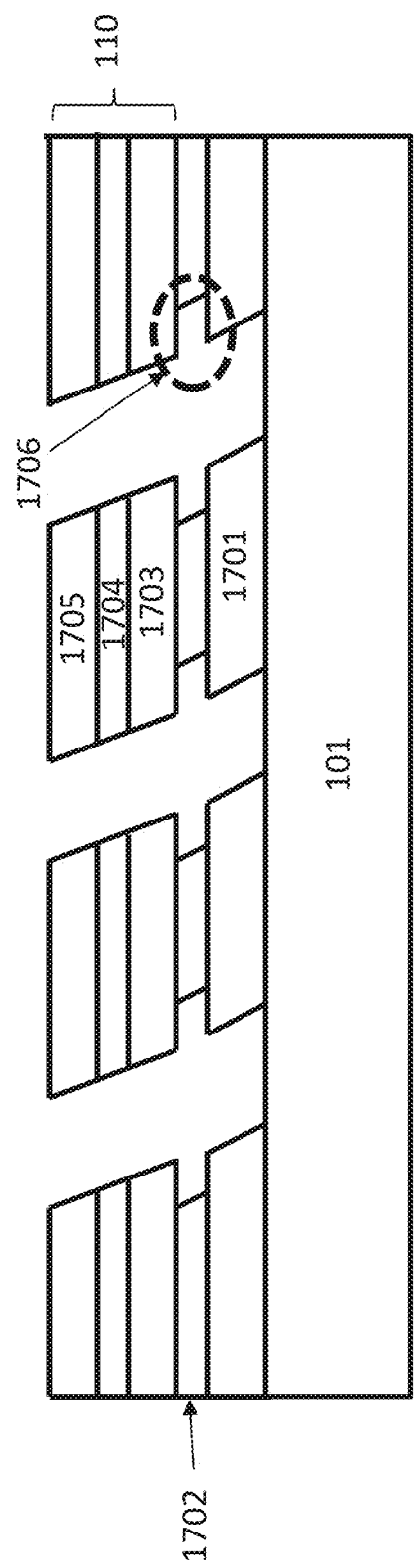
Figure 17D:
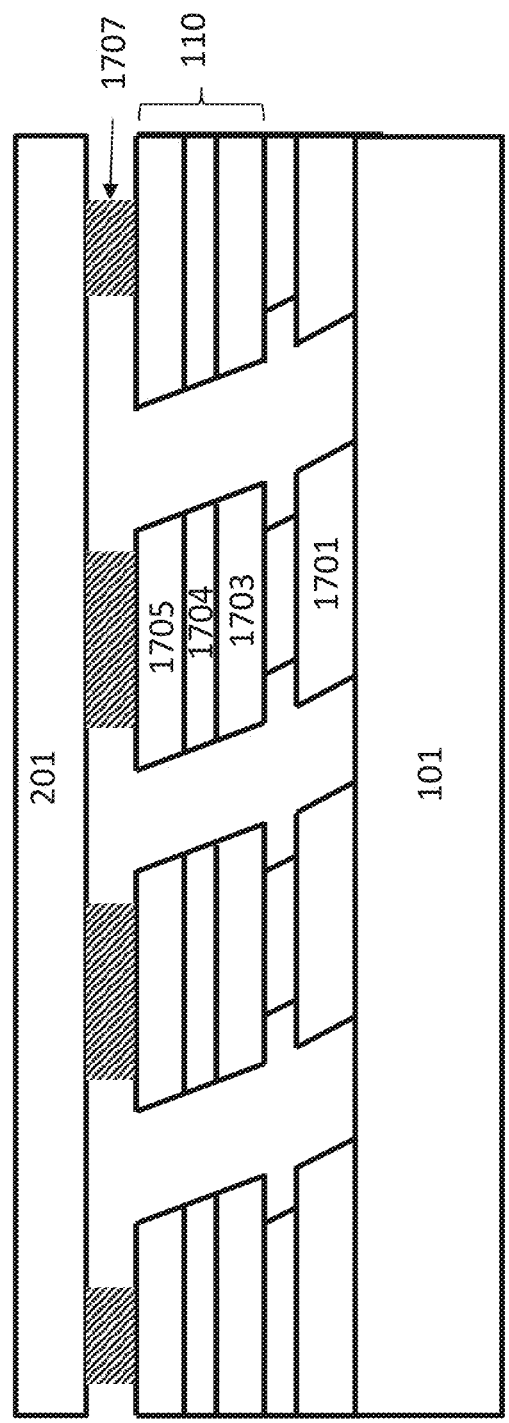
Figure 17E:
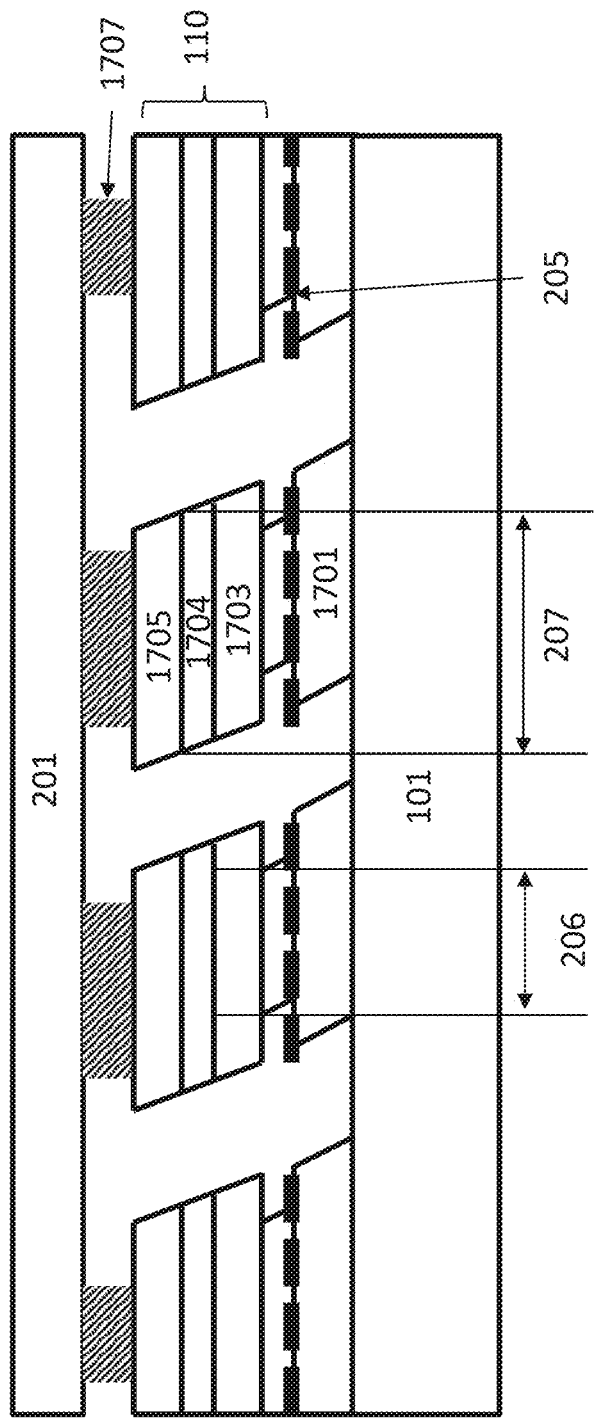
Figure 17F:
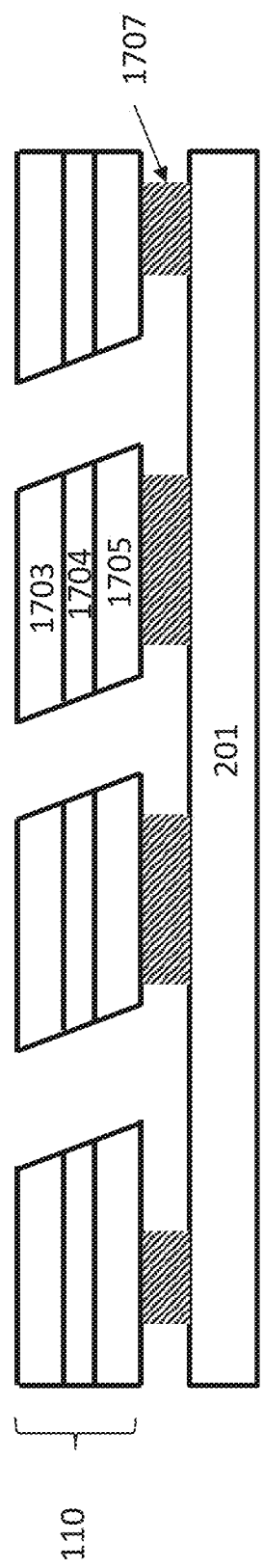

Specifically, the method includes the following steps:
1. Expose the InAlGaN sacrificial layers 1702. As shown in FIG. 17(a), the InAlGaN sacrificial layers 1702 are grown between the InAlGaN layers 1701 and 1703. The semiconductor devices 110 are comprised of InAlGaN layers 1703, 1704, 1705. For example, the devices 110 may comprise LEDs comprised of n-type GaN, InGaN/GaN multiple quantum wells (MQWs) and p-type GaN.
2. Etching to expose InAlGaN sacrificial layers 1702. As shown in FIG. 17(b), dry etching is performed to expose the InAlGaN sacrificial layers 1702. In addition, angle etching is better for cleaving.
3. Forming an undercut notch 1706 in the InAlGaN sacrificial layers 1702. As shown in FIG. 17(c), the InAlGaN sacrificial layers 1702 are partially but not fully etched and an undercut notch 1706 is formed.
4. Bonding the support substrate 201 to the devices 110 using bonding materials. As shown in FIG. 17(d), p-electrodes 1707 of the devices 110 are flip-chip bonded to a support substrate 201, such as a carrier wafer comprised of Si, Cu, etc., using metal-metal bonding or soldering techniques. Support films 1101 may also be used.
5. Cleaving to remove the III-nitride based substrate 101. As shown in FIG. 17(e), cleaving is performed at a cleaving point 205 to remove the devices 110 from the III-nitride based substrate 101 along a cleaving length 206, which is less than the device size 207. At least part of an m-plane is used for cleaving. FIG. 17(f) shows the device 110 with the substrate 101 removed.

InAlGaN Sacrificial Layers

In this embodiment, the InAlGaN sacrificial layers 1702 include In, Al, Ga, N, as well as impurities, such as Mg, Si, Zn, O, C, H, etc. The InAlGaN sacrificial layers 1702 have a band-gap larger than wavelength of an ultraviolet (UV) light source. For example, a 405 nm UV light is used and the band-gap of the sacrificial layers 1702 is larger than 3.06 eV. In this case, the sacrificial layers 1702 can absorb the UV light to generate the electrons and holes during PEC etching.

Etching Sacrificial Layers

In this embodiment, the etching region is the place which is etched by dry etching and/or wet etching to expose the InAlGaN sacrificial layer 1702. Angle etching is performed, since it can be helpful for the cleaving.

Undercut Notch in the InAlGaN Sacrificial Layers

In this embodiment, the undercut notch 1706 in the InAlGaN sacrificial layers 1702 can be formed by bandgap-selective PEC etching.

Also in this embodiment, the cleaving plane for the III-nitride materials is a nonpolar m-plane or a semipolar plane. Therefore, at least a partial m-plane is used for cleaving, which helps the cleaving occur easily, as well as result in a smooth surface.

Removing the Substrate by PEC Etching

As shown in FIG. 17(a), a bulk III-nitride substrate 101 with a nonpolar m-plane or semipolar plane orientation is provided. Growth is performed on the substrate 101 using MOCVD to fabricate n-type InAlGaN 1701, $In_xAl_yGa_{1-(x+y)}N$ sacrificial layers 1702, n-type InAlGaN 1703, an InGaN/GaN MQW active region 1704, and p-type InAlGaN 1705.

Trimethylgallium (TMGa), trimethylindium (TMIn) and triethylaluminium (TMAl) are used as the group-III elements source. Ammonia ($NH_3$) is used as the raw gas to supply Nitrogen. Hydrogen ($H_2$) and nitrogen ($N_2$) are used as carrier gases. Saline and Bis(cyclopentadienyl)magnesium ($Cp_2Mg$) are used as the n-type and p-type dopants. The pressure is set to be 50 to 760 Torr. The GaN growth temperature ranges from 900 to 1250° C. and the InAlGaN sacrificial layer growth temperature is from 800 to 1150° C.

The thickness of the $In_xAl_yGa_{1-(x+y)}N$ sacrificial layers 1702 is from 1 to 100 nm. The composition of x and y is from 0 to 1 and x+y also ranges from 0 to 1, as determined by the PEC etching.

For example, a 405 nm ultraviolet (UV) LED array may be used for PEC etching. Therefore, a band-gap of the $In_xAl_yGa_{1-(x+y)}N$ sacrificial layer 1702 of less than 3.06 V is desired, so that the sacrificial $In_xAl_yGa_{1-(x+y)}N$ layer 1702 can absorb the UV light to generate the electrons and holes during PEC etching.

$In_xAl_yGa_{1-(x+y)}N$/GaN stacks could be used as the sacrificial layers 1702 as well. For example, a 5 nm thick $In_{0.08}Ga_{0.92}N$ layer can be used as the sacrificial layer 1702.

Another example is to form the undercut notch 1706 using laser ablation. A 405 nm laser may be used in this example, and the sample is exposed to the laser source by carefully controlling the wafer position.

Angle etching may be performed by dry etching, such as reactive-ion etching (RIE), etc. For example, $SiCl_4$ may be used as the etching gas for RIE. The etching angle is from 0 to 90 degrees, which is useful for the cleaving process. The etching depth is from 10 nm to 20 μm, to expose the $In_xAl_yGa_{1-(x+y)}N$ sacrificial layer 1702.

PEC etching is performed to form an undercut notch 1706 in the region of the InGaN sacrificial layers 1702. The samples are dipped in a KOH solution and absorb the light from the 405 nm UV LEDs array. Then, the InAlGaN sacrificial layer 1702 would start to decompose by PEC. The InAlGaN sacrificial layer 1702 is partially but not fully etched to form the undercut notch 1706. For example, the width of the device is 100 μm and the size of the undercut notch 1706 in the InAlGaN sacrificial layer 1702 may range from 1 to 45 μm.

In this embodiment, as shown FIG. 17(e), the chip size is wider than cleaving length. This allows the semiconductor layers to be easily removed, even with less force or pressure. The use of less force or pressure avoids degradation of the device and reduction in the yield.

Process Steps

Figure 18:
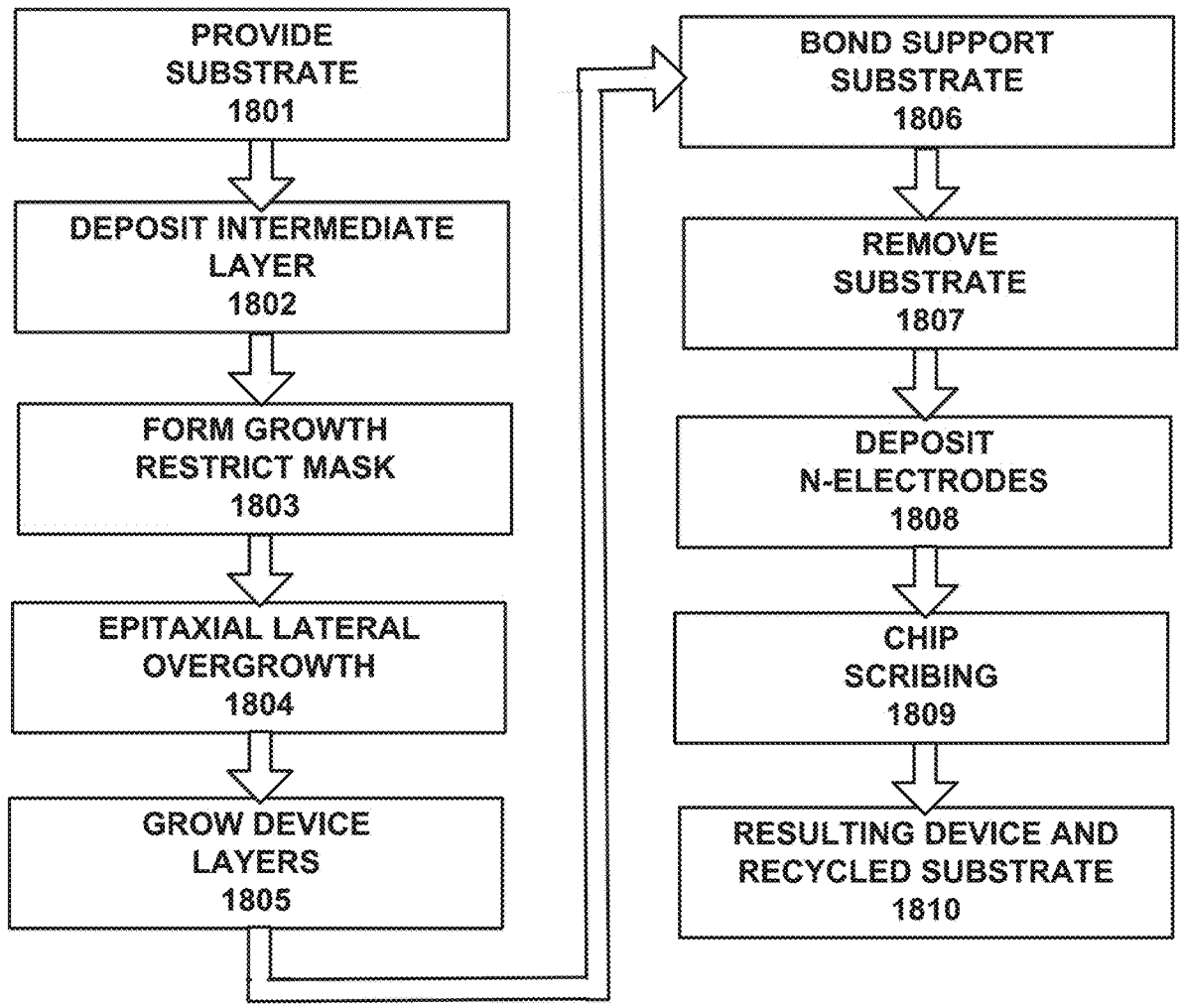
FIG. 18 is a flowchart illustrating the steps performed by the fabrication method of the present invention.

FIG. 18 is a flowchart that illustrates the method of removing III-nitride based substrates from III-nitride based semiconductor layers, after forming devices from the III-nitride based semiconductor layers, so that the III-nitride based substrates can be recycled, according to one embodiment of the present invention.

Block 1801 represents the step of providing a base substrate 101. In one embodiment, the base substrate 101 is a III-nitride based substrate 101, such as a GaN-based substrate 101.

Block 1802 represents an optional step of depositing an intermediate layer on the substrate 101. In one embodiment, the intermediate layer is a III-nitride based layer, such as a GaN-based layer.

Block 1803 represents the step of forming a growth restrict mask 102 on or above the substrate 101, i.e., on the substrate 101 itself or on the intermediate layer. The growth restrict mask 102 is patterned to include a plurality of stripes 102a and opening areas 103.

Block 1804 represents the step of growing one or more III-nitride based layers 105 on or above the growth restrict mask 102 using epitaxial lateral overgrowth, wherein the epitaxial lateral overgrowth of the III-nitride layers 105 extends in a direction parallel to the opening areas 103 of the growth restrict mask 102, and the epitaxial lateral overgrowth is stopped before the III-nitride layers 105 coalesce on the stripes 102a of the growth restrict mask 102. In one embodiment, the ELO III-nitride based layer 105 is an ELO GaN-based layer 105.

Block 1805 represents the step of growing one or more additional III-nitride based semiconductor layers 106 on the ELO III-nitride based layer 105. These additional III-nitride based semiconductor layers 106, along with the ELO III-nitride based layer 105, create one or more of the island-like III-nitride based semiconductor layers 109.

Block 1806 represents the step of bonding the island-like III-nitride based semiconductor layers 109 to a support substrate 201 or film 1101. The island-like III-nitride based semiconductor layers 109 are flip-chip bonded to a support substrate 201 with metal or solder 204 deposited thereon using metal-metal bonding or soldering techniques with p-electrodes 204, while the film 1101 is roll-applied to the p-electrodes 204.

Block 1807 represents the step of removing the island-like III-nitride based semiconductor layers 109 from the substrate 101 using a cleaving technique on a surface of the substrate 101, which includes mechanically separating or peeling the island-like III-nitride based semiconductor layers 109 from the substrate 101.

The surface of the substrate 101 on which the cleaving technique is performed is an m-plane surface 209 of the substrate 101, and the island-like III-nitride based semiconductor layers 109 have a cleaved surface 208 after being removed from the substrate 101, wherein the cleaved surface 208 at least comprises an m-plane surface. The island-like III-nitride based semiconductor layers 109 are also at least partially comprised of m-plane layers.

The cleaving technique is performed on the surface of the substrate 101 at a cleaving point 205 for a cleaving length 206, and the cleaving length 206 may be narrower than a size 207 of a device 110 formed from the island-like III-nitride based semiconductor layers 109.

The growth restrict mask 102 may be at least partially dissolved by a solvent, before the cleaving technique is performed. In addition, this step may include applying stress to the island-like III-nitride based semiconductor layers 109 due to differences in thermal expansion between the substrate 101 and the support substrate 201 or film 1101 bonded to the island-like III-nitride based semiconductor layers 109 to expose the cleaving point 205.

Block 1808 represents the step of depositing n-electrodes 211 on the back side of the island-like III-nitride based semiconductor layers 109, which is exposed by the lift-off of the substrate 101.

Block 1809 represents the step of chip scribing to separate the devices 110. This step may also include the etching of facets for laser diode devices 110.

Block 1810 represents the resulting product of the method, namely, one or more III-nitride based semiconductor devices fabricated according to this method, as well as a substrate 101 that has been removed from the devices and is available for recycling and reuse.

Advantages and Benefits

The present invention provides a number of advantages and benefits:

Utilizing the cleavage of the m-plane of III-nitride achieved a high yield when removing III-nitride based semiconductor layers 109 from the substrate 101.

Expensive III-nitride based substrates 101 can be reused after the substrates 101 are removed from the device 110 layers.

High quality device 110 layers may be obtained using a substrate 101 of the same or similar materials, with a very low defect density.

Using the same or similar materials for both the substrate 101 and the device layers 108 can reduce the strain in the device 110 layers.

Using materials with the same or similar thermal expansion for both the substrate 101 and the device 110 layers can reduce bending of the substrate 101 during epitaxial growth.

Slicing the substrate 101 from a bulk crystal with a miscut orientation maintains the uniformity of thickness between the device 110 layers and produces a higher yield.

Layers 105 grown by ELO are of high quality.

The ELO layers 105 do not coalesce with each other, and internal strain is released, which helps to avoid any occurrences of cracks. For device 110 layers that are AlGaN layers, this is very useful, especially in the case of high Al content layers.

The island-like III-nitride based semiconductor layers 109 are formed in isolation, so tensile stress or compressive stress does not fall upon other island-like III-nitride based semiconductor layers 109.

Also, the growth restrict mask 102 and the ELO layers 105 are not bonded chemically, so the stress in the ELO layers 105 and additional layers 106 can be relaxed by a slide caused at the interface between the growth restrict mask 102 and the ELO layers 105.

The existence of the no-growth regions 104 between each of the island-like III-nitride based semiconductor layers 109 provides flexibility, and the substrate 101 is easily deformed when external force is applied and can be bended. Therefore, even if there occurs a slight warpage, curvature, or deformation in the substrate 101, this can be easily corrected by a small external force, to avoid the occurrence of cracks. As a result, the handling of the substrates 101 by vacuum chucking is possible, which makes the manufacturing process of the semiconductor devices more easily carried out.

The no-growth region 104 makes it is easy to dissolve a large area of the growth restrict mask 102.

Device 110 layers of high quality semiconductor crystal can be grown by suppressing the curvature of the substrate 101, and further, even when the device 110 layers are very thick, the occurrences of cracks, etc., can be suppressed, and thereby a large-area semiconductor device can be easily realized.

Thermal management of the devices 110 improve significantly due to the flip-chip bonding on the support substrate 201.

The device 110 size is reduced by about 10 times when compared to the commercially available devices.

The fabrication method can also be easily adopted to large size wafers (>2 inches).

Modifications and Alternatives

A number of modifications and alternatives can be made without departing from the scope of the present invention.

For example, the present invention may be used with III-nitride based substrates of other orientations. Specifically, the substrates may be basal nonpolar m-plane {1 0 −1 0} families; and semipolar plane families that have at least two nonzero h, i, or k Miller indices and a nonzero 1 Miller index, such as the {2 0 −2 −1} planes. Semipolar substrates of (20-2-1) are especially useful, because of the wide area of flattened ELO growth.

According to the present invention, the crystallinity of the island-like III-nitride based semiconductor layers laterally growing upon the growth restrict mask from a striped opening of the growth restrict mask is very high, and III-nitride based semiconductor layers made of high quality semiconductor crystal can be obtained.

Furthermore, two advantages may be obtained using a III-nitride based substrate. One advantage is that a high-quality island-like III-nitride based semiconductor layer can be obtained, such as with a very low defects density than using a sapphire substrate. Another advantage, by using a similar or same material for both the epilayer and the substrate, is that it can reduce the strain in the epitaxial layer. Also, thanks to a similar or same thermal expansion, the method can reduce the amount of bending of the substrate during epitaxial growth. The effect, as above, is that the production yield can be high in order to improve the uniformity of temperature.

On the other hand, a foreign or hetero-substrate, such as sapphire (m-plane), $LiAlO_2$, SiC, Si, etc., can be used to grow the III-nitride based semiconductor layers. A foreign or hetero-substrate is easy to remove due to weak bonding strength at the cleaving point.

Consequently, the present invention discloses: a substrate comprised of a III-nitride based semiconductor; a growth restrict mask with one or more striped openings disposed directly or indirectly upon the substrate; and one or more island-like III-nitride based semiconductor layers grown upon the substrate using the growth restrict mask in the (1-100) plane orientation, wherein the striped openings of the growth mask extend in a direction parallel to the 0001 direction of the III-nitride based semiconductor layer.

Slicing the substrate from the GaN bulk crystal with a mis-cut orientation maintains the uniformity of thickness between the island-like III-nitride based layers.

In one embodiment, the growth restrict mask is deposited by sputter or electron beam evaporation or PECVD (plasma-enhanced chemical vaper deposition), but is not limited to those methods.

Also, when a plurality of island-like III-nitride based semiconductor layers are grown, these layers are separated from each other, that is, formed in isolation, so tensile stress or compressive stress generated in each III-nitride based semiconductor layer is limited within the III-nitride based semiconductor layer, and the effect of the tensile stress or compressive stress does not fall upon the other III-nitride based semiconductor layers. However, it is not necessary that the island-like III-nitride based semiconductor layers be separated.

Also, as the growth restrict mask and the III-nitride based semiconductor layer are not bonded chemically, the stress in the III-nitride based semiconductor layer can be relaxed by a slide caused at the interface between the growth restrict mask and the III-nitride based semiconductor layer.

Also, the existence of gaps between each of the island-like III-nitride based semiconductor layers results in the substrate having rows of a plurality of island-like III-nitride based semiconductor layers, which has flexibility, and therefore, it is easily deformed when external force is applied and can be bended.

Therefore, even if there occurs a slight warpage, curvature, or deformation in the substrate, this can be easily corrected by a small external force, to avoid the occurrence of cracks. As a result, the handling of substrates by vacuum chucking is possible, which makes the manufacturing process of the semiconductor devices more easily carried out.

As explained, island-like III-nitride based semiconductor layers made of high quality semiconductor crystal can be grown by suppressing the curvature of the substrate, and further, even when the III-nitride based semiconductor layer is very thick, the occurrences of cracks, etc., can be suppressed, and thereby a large area semiconductor device can be easily realized.

Finally, the present invention may be used to fabricate different opto-electronic device structures, such as a light-emitting diode (LED), laser diode (LD), Schottky barrier diode (SBD), or metal-oxide-semiconductor field-effect-transistor (MOSFET). The present invention may also be used to fabricate other opto-electronic devices, such as micro-LEDs, vertical cavity surface emitting lasers (VCSELs), edge-emitting laser diodes (EELDs), and solar cells.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A semiconductor substrate, comprising:
a main substrate, wherein a growth surface is a non-polar m-plane;
a growth restrict mask disposed on or above the main substrate, the growth restrict mask including a mask part separated by at least first and second openings;
a first set of semiconductor layers grown from the first opening in the growth restrict mask and disposed on or above the growth restrict mask;
a second set of semiconductor layers grown from the second opening in the growth restrict mask and disposed on or above the growth restrict mask;
the second opening spaced apart from the first opening such that the second set of semiconductor layers are adjacent to the first set of semiconductor layers;
wherein the first set of semiconductor layers comprises a first lower edge and a first protrusion part, the first lower edge disposed on the mask part, the first protrusion part protruding more towards the second set of semiconductor layers than the first lower edge does.

2. The semiconductor substrate of claim 1, wherein:
the growth restrict mask further comprises the first opening adjacent to the second opening in a first direction, the mask part disposed between the first opening and the second opening, the first lower edge disposed between a center of the mask part and the first opening in a planer view, and
the second set of semiconductor layers further comprises a second lower edge and a second protrusion part, the second lower edge disposed between the center of the mask part and the second opening in the planar view, the second protrusion part protruding more towards the first set of semiconductor layers in the planar view than the second lower edge does.

3. The semiconductor substrate of claim 2, wherein:
the first set of semiconductor layers further comprises a first upper edge, the first upper edge disposed between the center of the mask part and the first opening in the planar view, and
a first distance between the first opening and the first protrusion part in the first direction is greater than a second distance between the first opening and the first upper edge in the first direction.

4. The semiconductor substrate of claim 3, wherein:
the second set of semiconductor layers further comprises a second upper edge, the second upper edge disposed between the center of the mask part and the second opening in the planar view, and
a third distance between the second opening and the second protrusion part in the first direction is greater than a fourth distance between the second opening and the second upper edge in the first direction.

5. The semiconductor substrate of claim 3, wherein:
a side face of the first set of semiconductor layers further comprises a lower slope and an upper slope, the lower slope including the first lower edge, the upper slope including the first upper edge.

6. The semiconductor substrate of claim 3, wherein:
a distance between the mask and an edge of the first protrusion part in a second direction is larger than half of thickness of the first set of semiconductor layers, the second direction vertical to the first direction.

7. The semiconductor substrate of claim 4, wherein:
a minimal gap between the first set of semiconductor layers and the second set of semiconductor layers is smaller than a gap between the first lower edge and the second lower edge.

8. The semiconductor substrate of claim 2, wherein a first set of device layers is disposed on or above the first set of semiconductor layers.

9. The semiconductor substrate of claim 2, wherein the first set of the semiconductor layers overlaps the first opening in a second direction in the planar view, the second direction vertical to the first direction, and the second set of the semiconductor layers overlaps the second opening in the second direction in the planar view.

* * * * *